US012588523B2

(12) United States Patent 
Lin et al.

(10) Patent No.: US 12,588,523 B2 
(45) Date of Patent: *Mar. 24, 2026

(54) INFO-POP STRUCTURES WITH TIVS HAVING CAVITIES

(71) Applicant: Taiwan Semiconductor Manufacturing Co., Ltd., Hsinchu (TW)

(72) Inventors: Jing-Cheng Lin, Hsinchu (TW); Chen-Hua Yu, Hsinchu (TW); Po-Hao Tsai, Zhongli City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/401,877

(22) Filed: Jan. 2, 2024

(65) Prior Publication Data

US 2024/0136298 A1 Apr. 25, 2024

Related U.S. Application Data

(63) Continuation of application No. 17/360,313, filed on Jun. 28, 2021, now Pat. No. 11,901,302, which is a (Continued)

(51) Int. Cl. 
*H01L 23/538* (2006.01) 
*H01L 21/48* (2006.01) 
(Continued)

(52) U.S. Cl. 
CPC ...... *H01L 23/5389* (2013.01); *H01L 21/4853* (2013.01); *H01L 21/4857* (2013.01); *H01L 21/486* (2013.01); *H01L 21/565* (2013.01); *H01L 21/6835* (2013.01); *H01L 23/3114* (2013.01); *H01L 23/3121* (2013.01); *H01L 23/5383* (2013.01); *H01L 23/5386* (2013.01); 
(Continued)

(58) Field of Classification Search 
None 
See application file for complete search history.

(56) References Cited

U.S. PATENT DOCUMENTS

| | | | |
|---|---|---|---|
| 5,346,775 A | 9/1994 | Jin et al. | |
| 8,841,772 B2 | 9/2014 | Shimize et al. | |

(Continued)

FOREIGN PATENT DOCUMENTS

| | | |
|---|---|---|
| CN | 104810339 A | 7/2015 |
| CN | 106298716 A | 1/2017 |

(Continued)

*Primary Examiner* — Erik Kielin 
(74) *Attorney, Agent, or Firm* — Slater Matsil, LLP

(57) ABSTRACT

A method includes dispensing sacrificial region over a carrier, and forming a metal post over the carrier. The metal post overlaps at least a portion of the sacrificial region. The method further includes encapsulating the metal post and the sacrificial region in an encapsulating material, demounting the metal post, the sacrificial region, and the encapsulating material from the carrier, and removing at least a portion of the sacrificial region to form a recess extending from a surface level of the encapsulating material into the encapsulating material.

20 Claims, 32 Drawing Sheets

Related U.S. Application Data continuation of application No. 16/590,908, filed on Oct. 2, 2019, now Pat. No. 11,075,168, which is a continuation of application No. 15/907,473, filed on Feb. 28, 2018, now Pat. No. 10,515,901.

(60) Provisional application No. 62/565,489, filed on Sep. 29, 2017.

(51) Int. Cl.

| | |
|---|---|
| *H01L 21/56* | (2006.01) |
| *H01L 21/683* | (2006.01) |
| *H01L 23/00* | (2006.01) |
| *H01L 23/31* | (2006.01) |
| *H01L 25/00* | (2006.01) |
| *H01L 25/065* | (2023.01) |
| *H01L 25/10* | (2006.01) |

(52) U.S. Cl.

CPC .............. *H01L 24/19* (2013.01); *H01L 24/20* (2013.01); *H01L 25/0657* (2013.01); *H01L 25/105* (2013.01); *H01L 25/50* (2013.01); *H01L 23/3128* (2013.01); *H01L 2221/68345* (2013.01); *H01L 2221/68359* (2013.01); *H01L 2221/68372* (2013.01); *H01L 2224/18* (2013.01); *H01L 2224/214* (2013.01); *H01L 2224/2919* (2013.01); *H01L 2225/0651* (2013.01); *H01L 2225/06568* (2013.01); *H01L 2225/1035* (2013.01); *H01L 2225/1058* (2013.01)

(56) References Cited

U.S. PATENT DOCUMENTS

| | | | |
|---|---|---|---|
| 9,929,112 B2 | 3/2018 | Hsieh et al. | |
| 10,083,913 B2 | 9/2018 | Tsai et al. | |
| 10,163,862 B2 | 12/2018 | Chen et al. | |
| 10,515,901 B2 * | 12/2019 | Lin | ..................... H01L 21/6835 |
| 11,901,302 B2 * | 2/2024 | Lin | ..................... H01L 21/4857 |
| 2007/0273049 A1 | 11/2007 | Khan et al. | |
| 2008/0150121 A1 | 6/2008 | Oganesian et al. | |
| 2009/0096085 A1 | 4/2009 | Lee et al. | |
| 2010/0133665 A1 | 6/2010 | Ha et al. | |
| 2011/0140259 A1 | 6/2011 | Cho et al. | |
| 2011/0241192 A1 | 10/2011 | Ding et al. | |
| 2012/0013000 A1 | 1/2012 | Haba | |
| 2012/0273938 A1 | 11/2012 | Choi et al. | |
| 2012/0319286 A1 | 12/2012 | Yang et al. | |
| 2013/0157418 A1 | 6/2013 | Choi et al. | |
| 2013/0256914 A1 | 10/2013 | Cheng et al. | |
| 2014/0124937 A1 * | 5/2014 | Wu | .......................... H01L 24/81 257/772 |
| 2014/0210101 A1 | 7/2014 | Lin et al. | |
| 2015/0035091 A1 | 2/2015 | Ziglioli | |
| 2015/0098204 A1 | 4/2015 | Yoshikawa et al. | |
| 2015/0123290 A1 | 5/2015 | Kim et al. | |
| 2015/0255433 A1 | 9/2015 | Daizo et al. | |
| 2016/0172299 A1 | 6/2016 | Noveski et al. | |
| 2016/0218049 A1 | 7/2016 | Lin et al. | |
| 2016/0262268 A1 * | 9/2016 | Co | .................... B29C 45/14754 |
| 2016/0307778 A1 | 10/2016 | Lin et al. | |
| 2017/0032977 A1 | 2/2017 | Chen et al. | |
| 2017/0092604 A1 | 3/2017 | Hsieh et al. | |
| 2017/0294413 A1 | 10/2017 | Shi et al. | |
| 2018/0145061 A1 | 5/2018 | Jeong et al. | |

FOREIGN PATENT DOCUMENTS

| | | |
|---|---|---|
| CN | 106558559 A | 4/2017 |
| JP | 2015076465 A | 4/2015 |
| KR | 20160123964 A | 10/2016 |
| KR | 20170037480 A | 4/2017 |

* cited by examiner

400

Coating LTHC/polymer buffer layer over a carrier — 402

Forming polymer dots over the carrier — 404

Forming a metal seed layer — 406

Forming metal posts — 408

Attaching a device die — 410

Encapsulating and planarization — 412

Forming RDLs over the first RDLs — 414

Forming electrical connectors — 416

Carrier removal — 418

Removing polymer dots to from recesses — 420

Bonding top packages — 422

Singulation — 424

INFO-POP STRUCTURES WITH TIVS HAVING CAVITIES

PRIORITY CLAIM AND CROSS-REFERENCE

This application is a continuation of U.S. patent application Ser. No. 17/360,313, entitled InFO-POP structures with TIVs Having Cavities", and filed Jun. 28, 2021, which is continuation of U.S. patent application Ser. No. 16/590,908, entitled "InFO-POP structures with TIVs Having Cavities," and filed Oct. 2, 2019, now U.S. Pat. No. 11,075,168 issued Jul. 27, 2021, which is a continuation of U.S. patent application Ser. No. 15/907,473, entitled "InFO-POP structures with TIVs Having Cavities," and filed Feb. 28, 2018, now U.S. Pat. No. 10,515,901 issued Dec. 24, 2019, which claims the benefit of U.S. Provisional Application No. 62/565,489, entitled "InFO-POP structures with TIVs Having Cavities," and filed Sep. 29, 2017, and entitled "InFO-POP structures with TIVs Having Cavities," which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
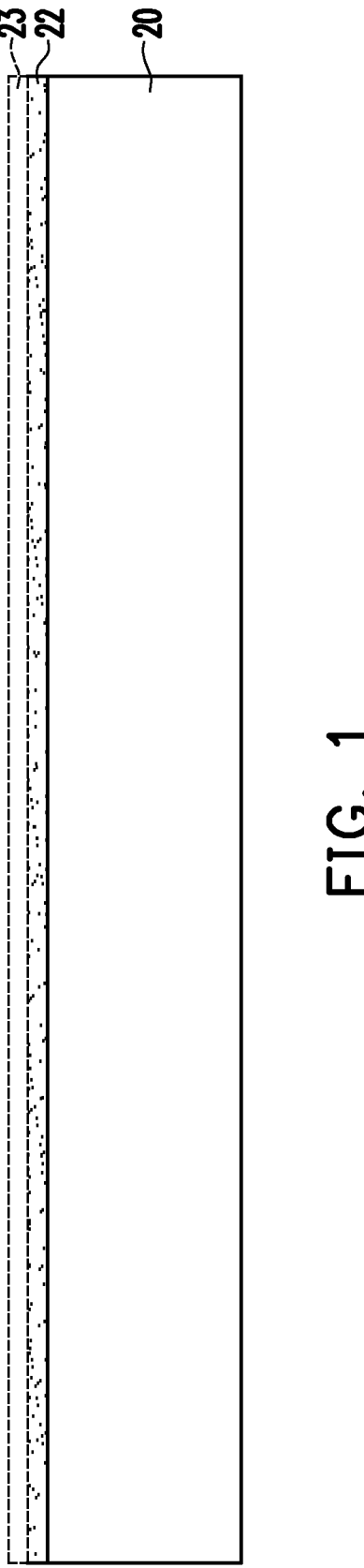
FIGS. 1, 2A, and FIGS. 3 through 18 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package and the method of forming the same are provided in accordance with various exemplary embodiments. The intermediate stages of forming the InFO package are illustrated in accordance with some embodiments. Some variations of some embodiments are discussed. Throughout the various views and illustrative embodiments, like reference numbers are used to designate like elements.

Figure 31:
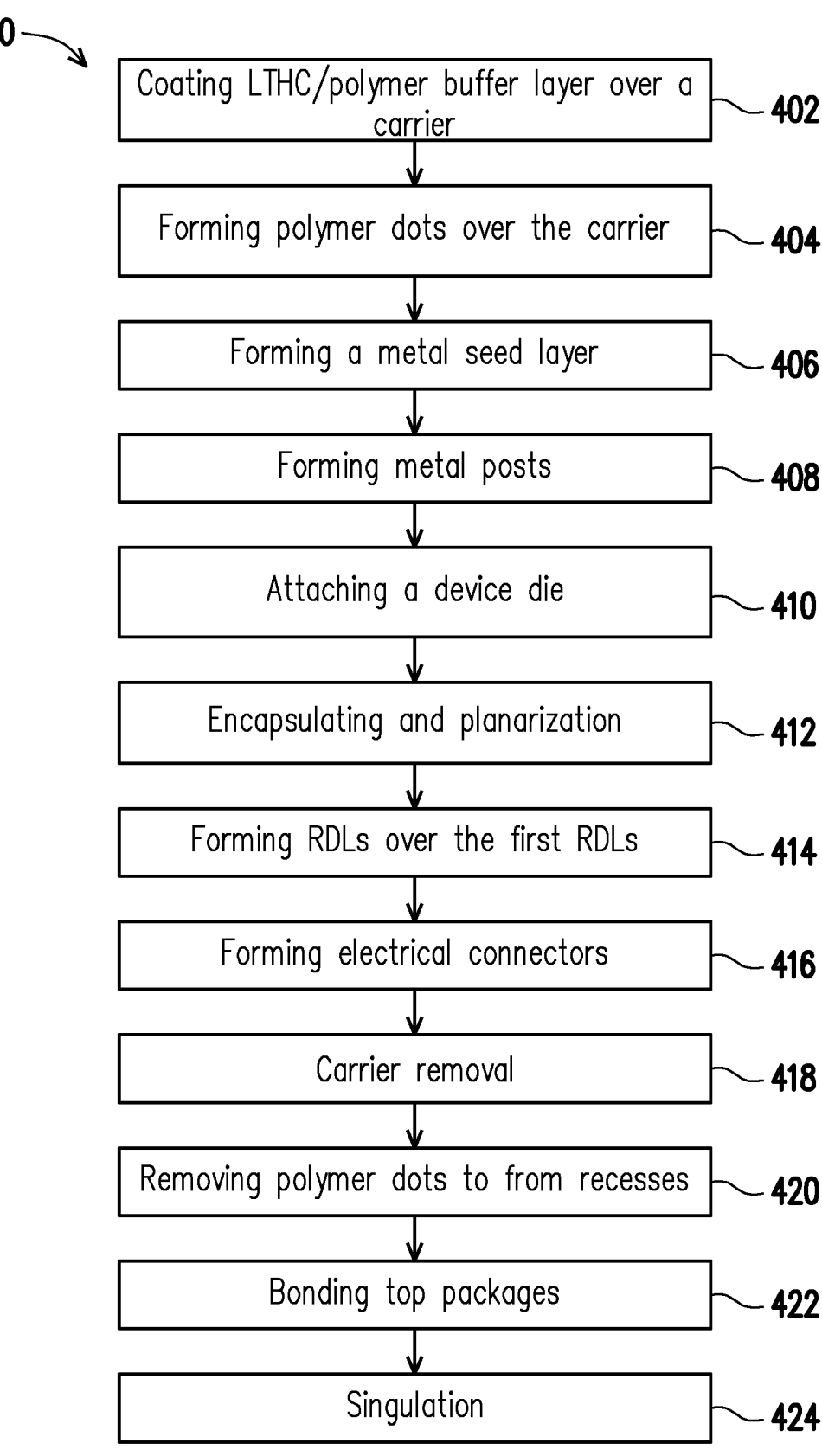
FIG. 31 illustrates a process flow for forming a package in accordance with some embodiments.

FIGS. 1, 2A, and FIGS. 3 through 18 illustrate the cross-sectional views of intermediate stages in the formation of a package in accordance with some embodiments. The processes shown in FIG. 1 through 18 are also illustrated schematically in the process flow 400 shown in FIG. 31.

Referring to FIG. 1, carrier 20 is provided, and release film 22 is coated on carrier 20. The respective step is shown as step 402 as illustrated in the process flow in FIG. 31. Carrier 20 may be a glass carrier, a ceramic carrier, an organic carrier, or the like. Release film 22 is in physical contact with the top surface of carrier 20. Release film 22 may be formed of a Light-To-Heat-Conversion (LTHC) coating material. Release film 22 may be applied onto carrier 20 through coating. In accordance with some embodiments of the present disclosure, the LTHC coating material is capable of being decomposed under the heat of light/ radiation (such as laser), and hence can release carrier 20 from the structure formed thereon. In accordance with some embodiments of the present disclosure, LTHC coating material 22 includes carbon black (carbon particles), a solvent, a silicon filler, and/or an epoxy. The epoxy may include polyimide or another polymer such as Acrylic. LTHC coating material 22 may be coated in a flowable form, and is then cured, for example, under ultra-violet (UV) light.

In accordance with some embodiments, as shown in FIG. 1, polymer buffer layer 23 is formed on LTHC coating material 22. In accordance with some embodiments, polymer buffer layer 23 is formed of polybenzoxazole (PBO), polyimide, benzocyclobutene (BCB), or another applicable polymer. In accordance with alternative embodiments, polymer buffer layer 23 is not formed. Accordingly, polymer buffer layer 23 is illustrated using dashed lines to indicate it may or may not be formed.

FIGS. 2A through 7 illustrate the formation of metal posts 36. Throughout the description, metal posts 36 are alternatively referred to as through-vias 36 since metal posts 36 may penetrate through the subsequently dispensed encapsulating material.

Figure 2A:
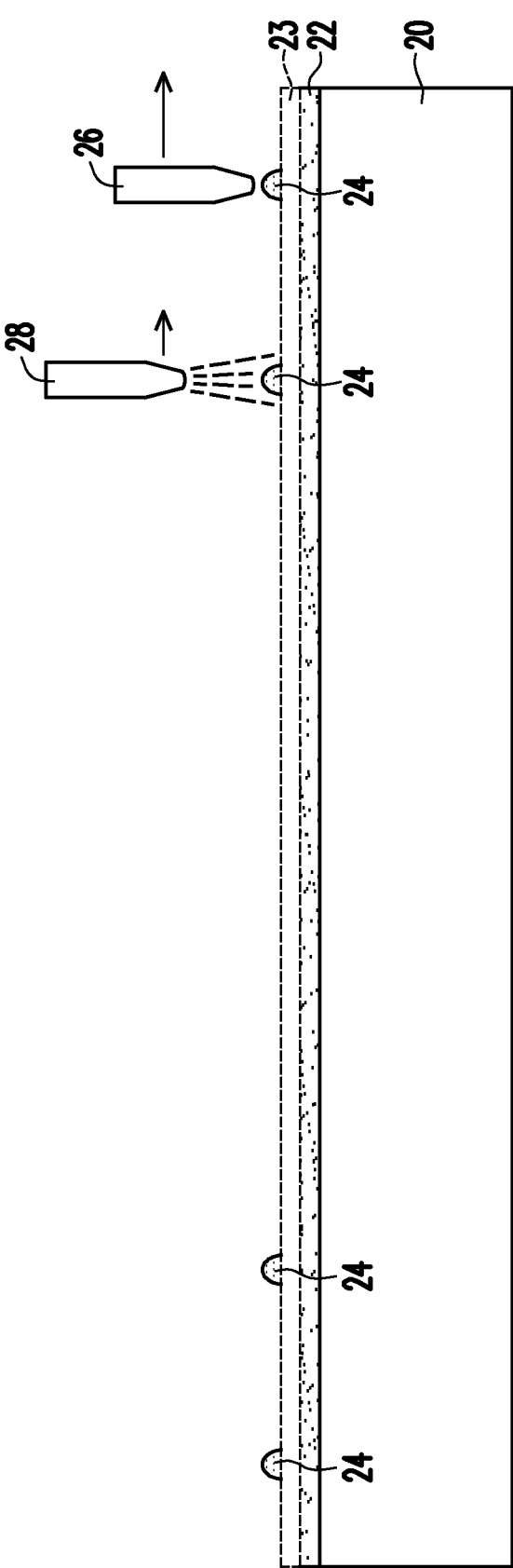

Referring to FIG. 2A, sacrificial material/dots 24 are formed. In accordance with some embodiments of the present disclosure, sacrificial dots 24 are formed of a polymer, which may be formed of acrylic, epoxy, PBO, polyimide, or the like. Sacrificial dots 24 may also be formed of molding compound, a liquid or gel type of die-attach film, underfill, molding underfill, or the like. Accordingly, sacrificial dots 24 are alternatively referred to as polymer dots hereinafter, although other material other than polymer can be used. The respective step is shown as step 404 as illustrated in the process flow in FIG. 31.

Figure 29:
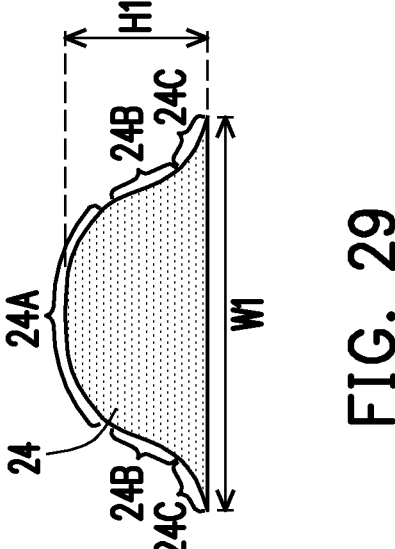

In accordance with some embodiments of the present disclosure, polymer dots 24 are formed through dispensing, stencil print, or the like. When dispensed or printed, polymer dots 24 may be slightly flowable with high viscosity. Accordingly, after the dispensing or printing, the top and sidewall shapes of polymer dots become smoothened and curved. FIG. 29 illustrates an amplified view of polymer dot 24. In accordance with some embodiments of the present disclosure, width W1 of polymer dots 24 is in the range between about 100 μm and about 170 μm, and the height H1 of polymer dot 24 may be in the range between about 5 μm and about 100 μm.

In accordance with some embodiments of the present disclosure, polymer dots 24 are dispensed by dispenser 26 (FIG. 2A), and are then cured using curing unit 28, which may cure polymer dots 24 through Ultra-Violet (UV) curing, thermal curing, or the like. By on-going curing polymer dots 24, rather than simultaneously curing all polymer dots after all polymer dots 24 on carrier 20 have been dispensed, there is a uniform time interval between the dispensing and the curing of polymer dots 24. The uniform time interval results in a substantially uniform width and a substantially uniform height for polymer dots 24, so that the shapes of polymer dots 24 are uniform. Otherwise, longer interval may result in polymer dots 24 to collapse more, resulting in greater width W1 and smaller heights H1.

Figure 2B:
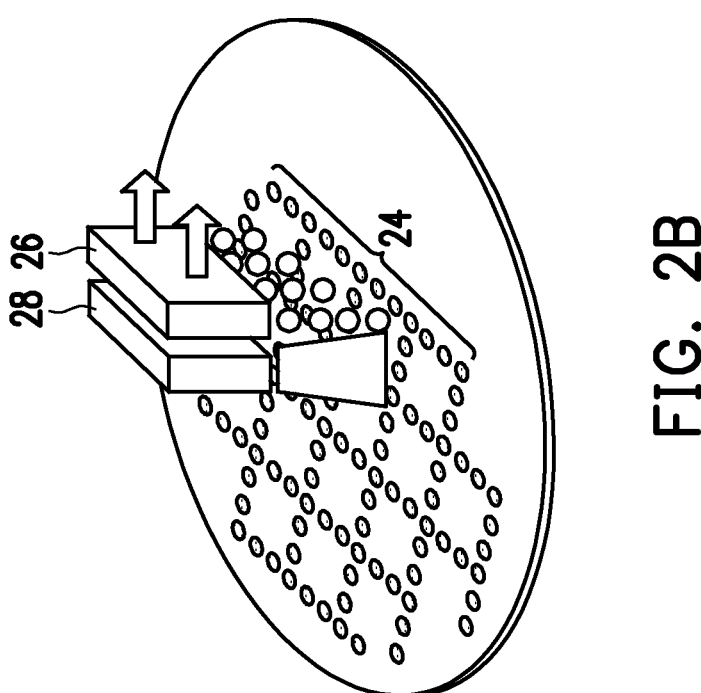
FIG. 2B illustrates a perspective view in the dispensing of polymer dots in accordance with some embodiments.

FIG. 2B illustrates a perspective view in the dispensing of polymer dots 24. In accordance with some embodiments of the present disclosure, dispenser 26 and curing unit 28 are controlled to have a uniform spacing, and curing unit 28 follows the movement of dispenser 26. Accordingly, after a fixed time interval after the dispensing of polymer dots 24, curing unit 28 moves to the top of the dispensed polymer dots 24 to cure them. Polymer dots 24 are dispensed to the locations at which metal posts are to be formed.

Figure 28A:
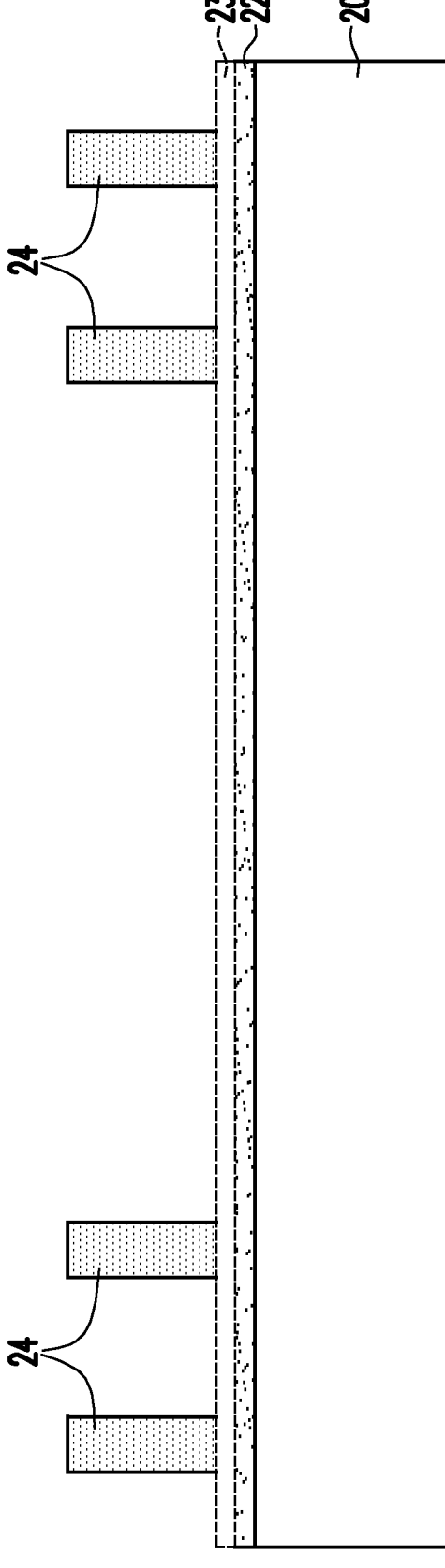
FIGS. 28A and 28B illustrate a cross-sectional view and a top view, respectively, of an elongate photo resist in accordance with some embodiments.

In accordance with alternative embodiments of the present disclosure, polymer dots 24 are formed of a photo resist, and the formation process include dispensing a photo resist, performing a light-exposure on the photo resist using a photolithography mask, and developing the photo resist. The remaining portions of the photo resist are the polymer dots 24. The resulting polymer dots 24 may have substantially straight and vertical edges, which are schematically illustrated in FIG. 28A.

Figure 18:
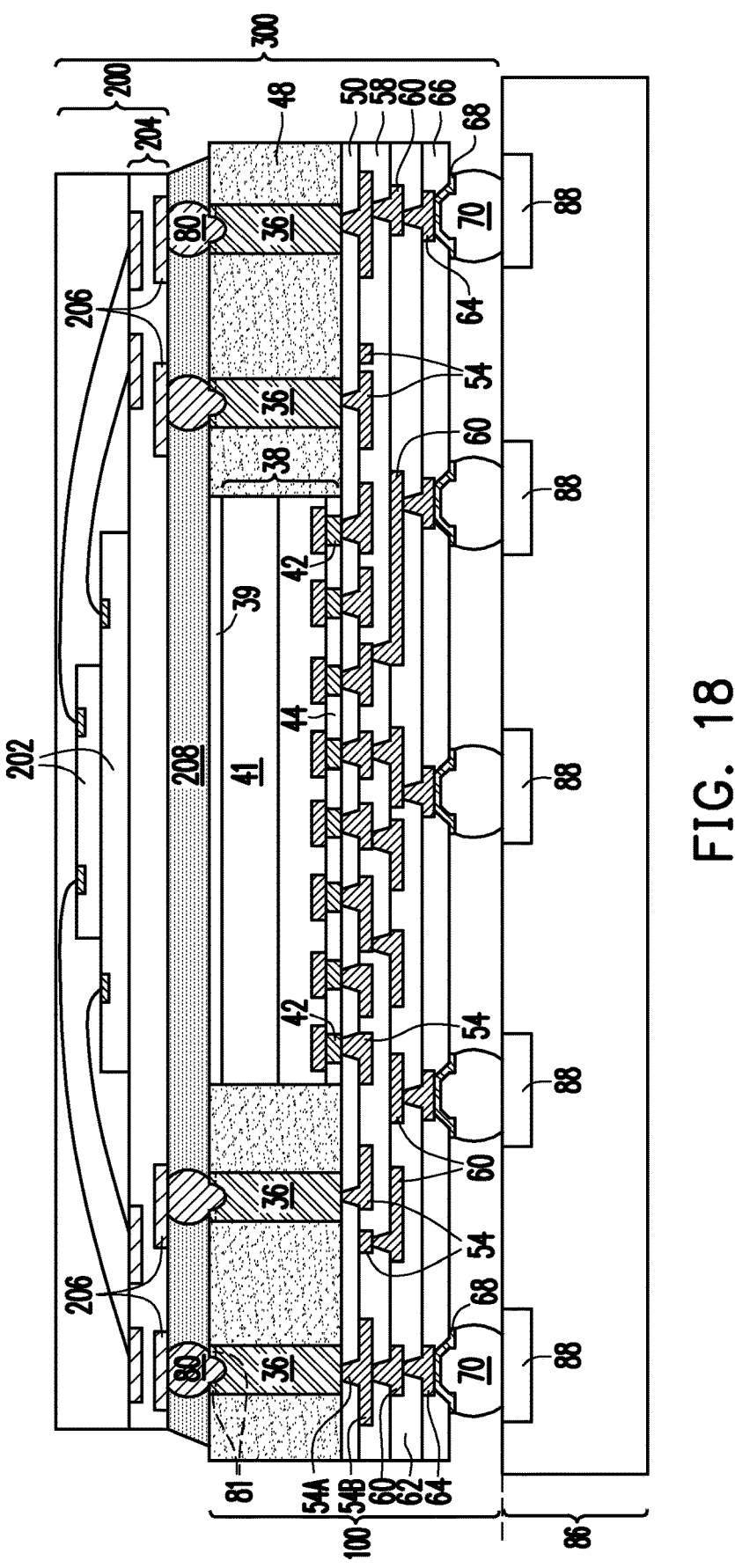
Figure 28B:
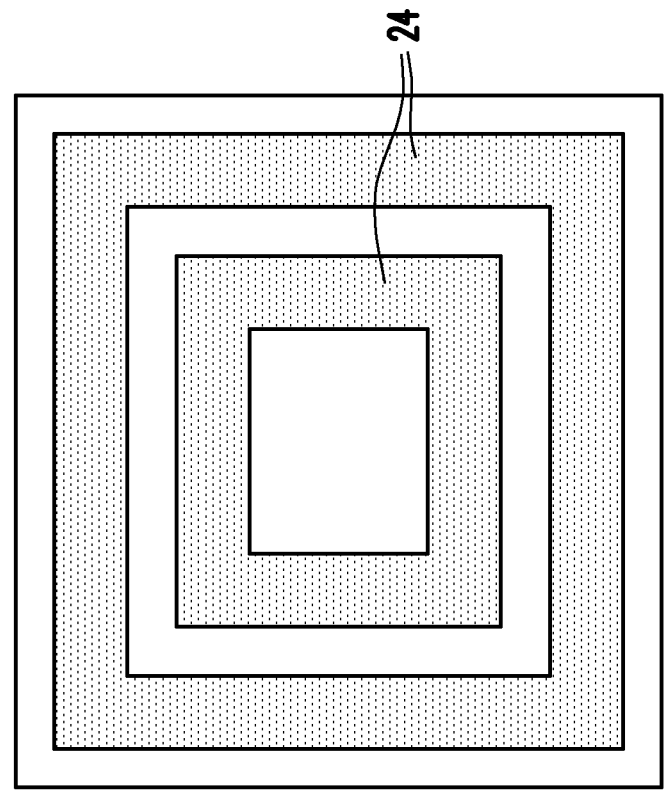

Sacrificial dots may be formed as strips rather than discrete dots. Accordingly, polymer strips are formed. FIG. 28B illustrates a top view of exemplary polymer strip 24. In accordance with some embodiments, polymer strips 24 are formed as elongated strips or blocks. The polymer strips may also have the shapes of rings, as shown in FIG. 28B. It is appreciated that the patterns of polymer strips 24 as shown in FIG. 28B may be repeated on carrier 20 (FIG. 2A) to form an array, each for forming one package as shown in FIG. 18.

Figure 3:
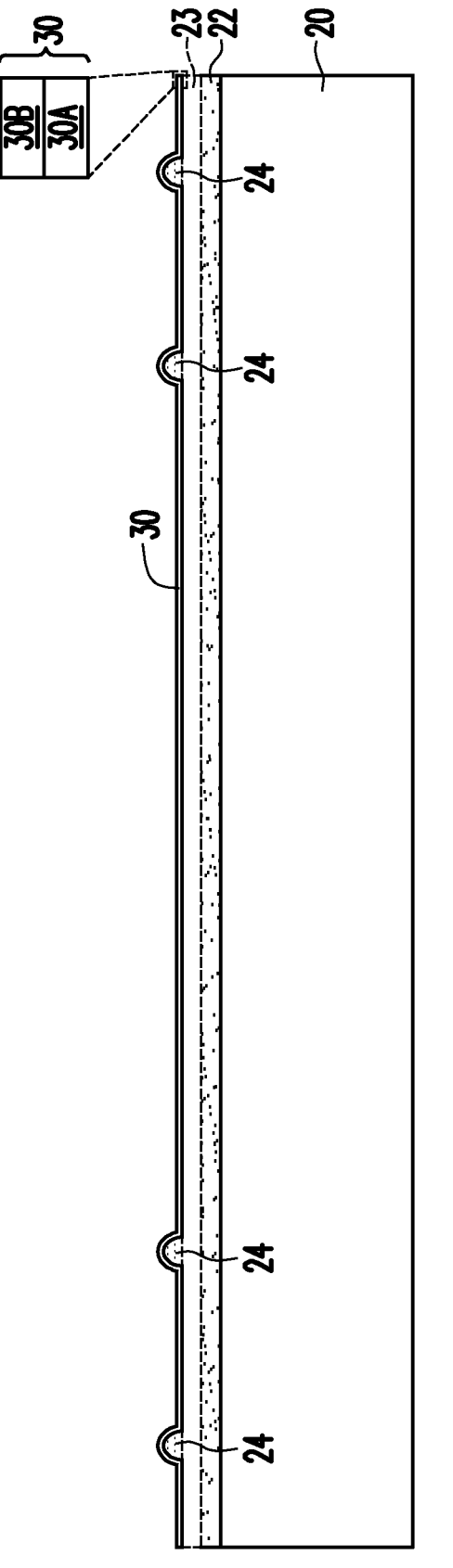

Referring to FIG. 3, metal seed layer 30 is formed, for example, through Physical Vapor Deposition (PVD) or the like. The respective step is shown as step 406 as illustrated in the process flow in FIG. 31. In accordance with some embodiments of the present disclosure, metal seed layer 23 is over and in contact with polymer buffer layer 23 and polymer dots 24. In accordance with alternative embodiments of the present disclosure, buffer layer 23 is not formed between LTHC coating 22 and metal seed layer 30, and hence metal seed layer 30 is in physical contact with LTHC coating material 22. In accordance with some embodiments of the present disclosure, metal seed layer 30 includes titanium layer 30A (as shown in the amplified region) and a copper layer 30B over the titanium layer 30A. In accordance with alternative embodiments of the present disclosure, metal seed layer 30 includes a copper layer contacting LTHC coating 22. Metal seed layer 30 is a substantially conformal film, and hence the portions of metal seed layer 30 on polymer dots 24 have the profile following the profile of polymer dots 24.

Figure 4:
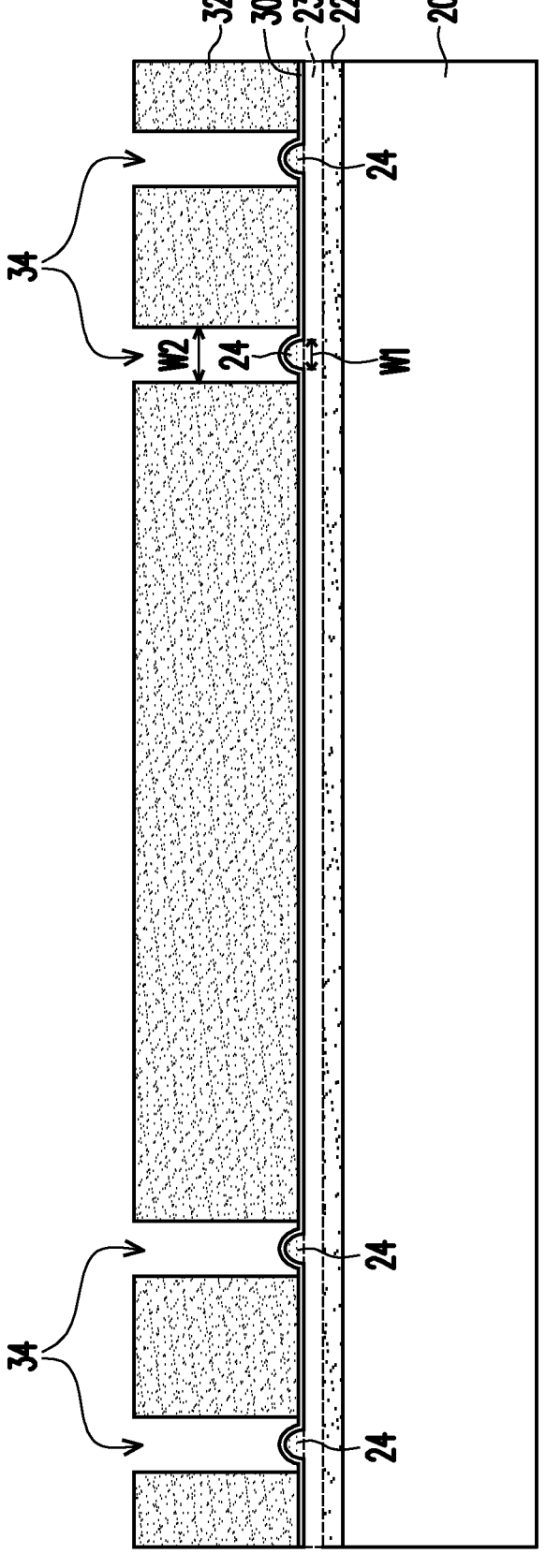

FIGS. 4, 5A, 5B, 6A, 6B, and 6C illustrate the formation of metal posts 36. The respective step is shown as step 408 as illustrated in the process flow in FIG. 31. Referring to FIG. 4, patterned mask 32 is formed. Patterned mask 32 may be formed of photo resist, and is referred to as photo resist 32 hereinafter. The formation of patterned photo resist 32 includes dispensing a blanket photo resist, and performing a light-exposure on photo resist 32 using a photo lithography mask (not shown). After a subsequent development, openings 34 are formed in photo resist 32. Some portions of metal seed layer 30 are exposed through openings 34. In accordance with some embodiments of the present disclosure, openings 34 are wider than polymer dots 24, and width W2 of openings 34 is greater than width W1 of polymer dots 24.

In accordance with alternative embodiments of the present disclosure, openings 34 are narrower than polymer dots 24.

Figure 5A:
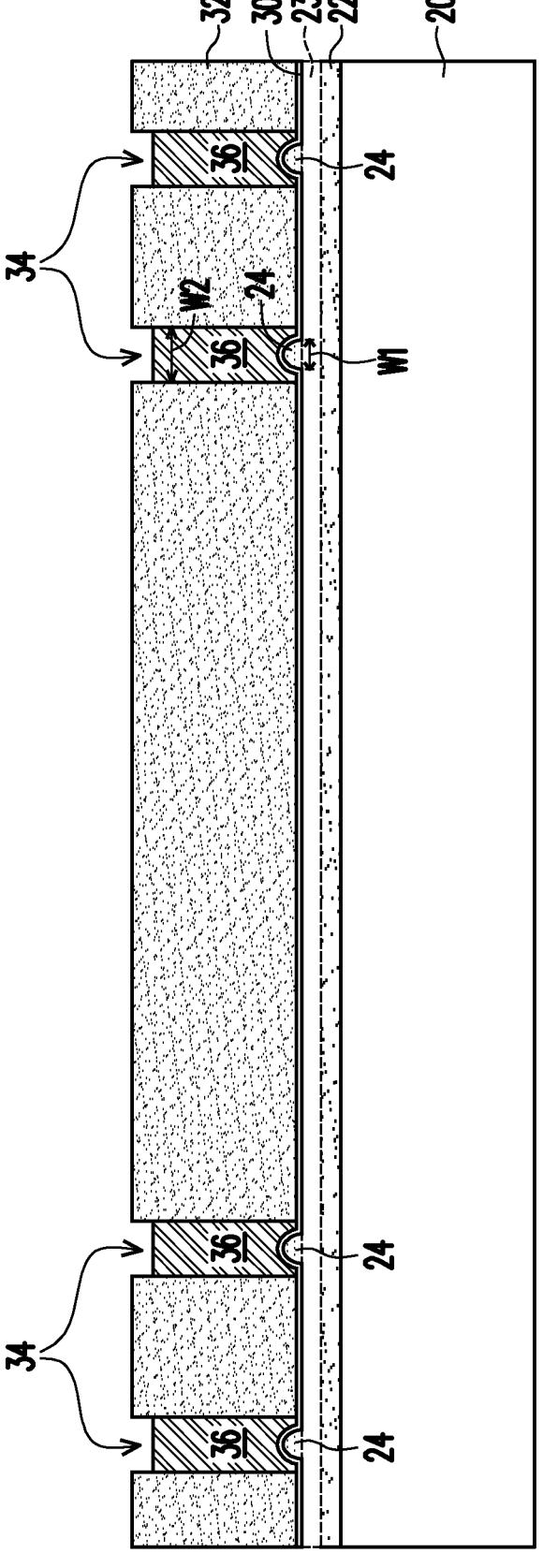

Next, as shown in FIG. 5A, metal posts 36 are formed by plating a metallic material in openings 34. Metal posts 36 are alternatively referred to as through-vias or through-molding vias since they will penetrate through the subsequently formed encapsulating material (which may be a molding compound) in the final package. The plated metallic material may be copper or a copper alloy. The top surfaces of metal posts 36 are lower than the top surface of photo resist 32, so that the shapes of metal posts 36 are confined by openings 34. Metal posts 36 may have substantially vertical and straight edges. Alternatively, metal posts 36 may have a sand-timer shape in a cross-sectional view, with the middle parts of metal posts 36 being narrower than the respective top parts and bottom parts.

Figure 5B:
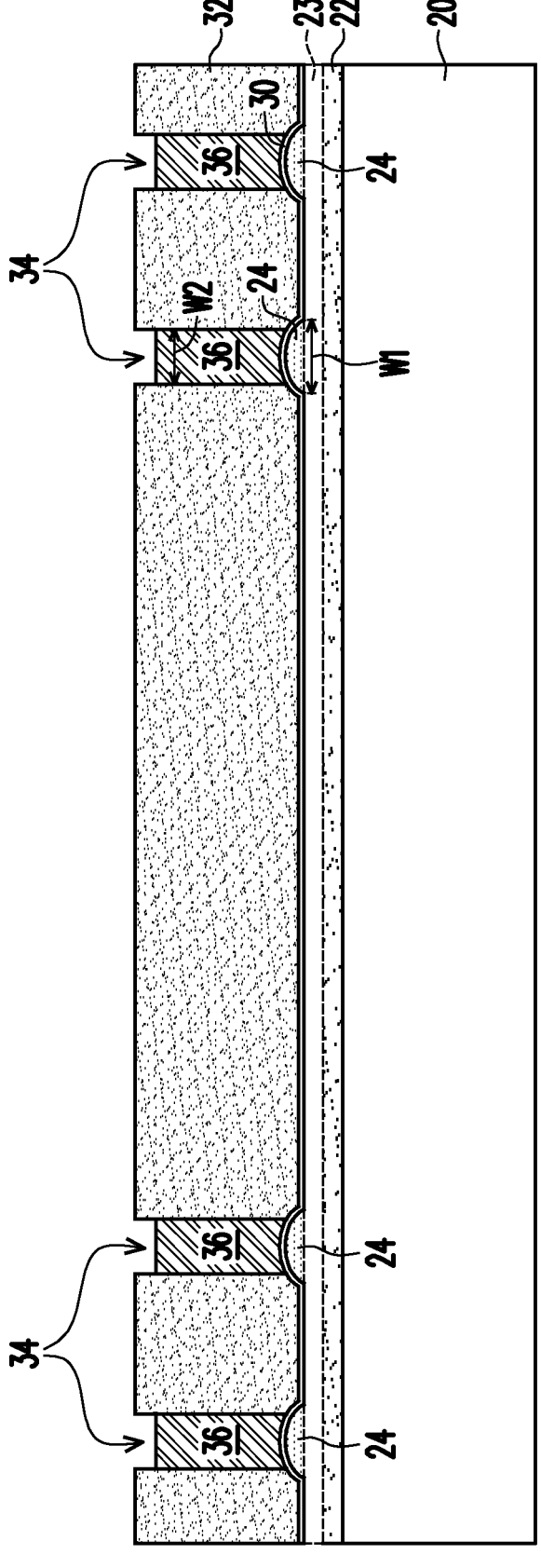

In FIG. 5A, the widths W2 of metal posts 36 are greater than the widths of polymer dots 24, and hence metal posts 36 extend beyond the edges of polymer dots 24. FIG. 5B illustrates the structure in accordance with some embodiments, in which the widths W1 of polymer dots 24 are greater than the widths of metal posts 36, and hence polymer dots 24 extend beyond the edges of the respective metal posts 36.

Figure 6A:
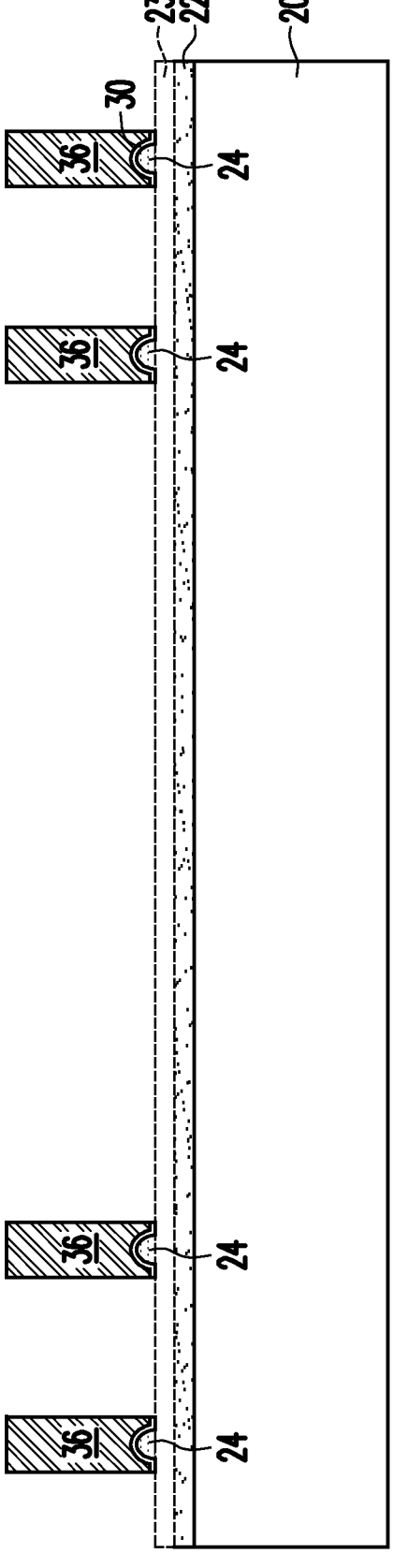

In subsequent steps, photo resist 32 is removed, and hence the underlying portions of metal seed layer 30 are exposed. The exposed portions of metal seed layer 30 are then removed in an etching step, for example, in an anisotropic or an isotropic etching step. The edges of the remaining seed layer 30 are thus flush with the respective overlying portions of metal posts 36. The resulting exemplary metal posts 36 are illustrated in FIG. 6A. Throughout the description, the remaining portions of metal seed layer 30 may be considered as parts of metal posts 36 or parts not belonging to metal posts 36. The top-view shapes of metal posts 36 include, and are not limited to, circular shapes, ellipse, rectangles, hexagons, octagons, and the like. After the formation of metal posts 36, LTHC coating material 22 or buffer layer 23 may be exposed.

Figure 6B:
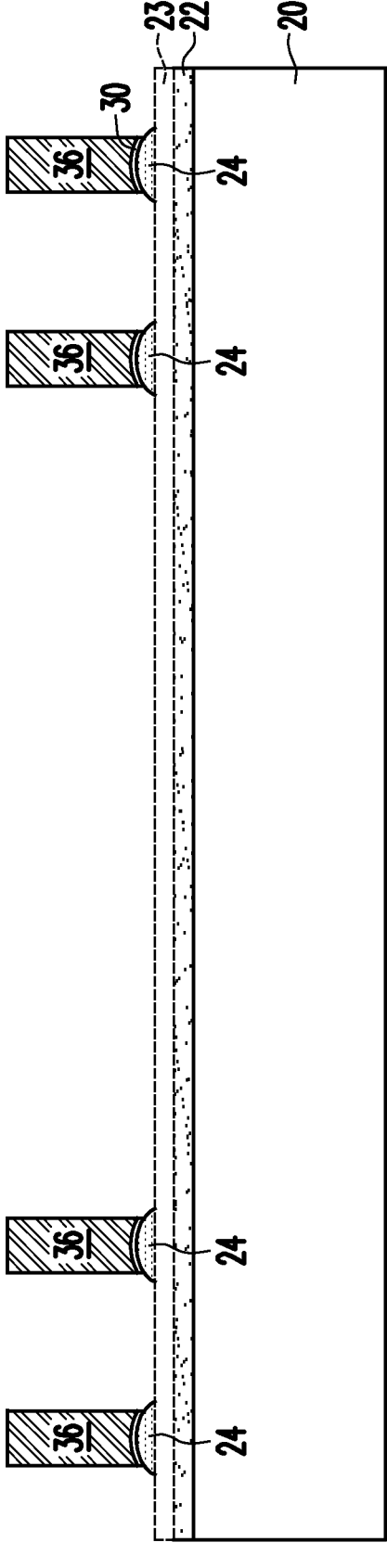
Figure 6C:
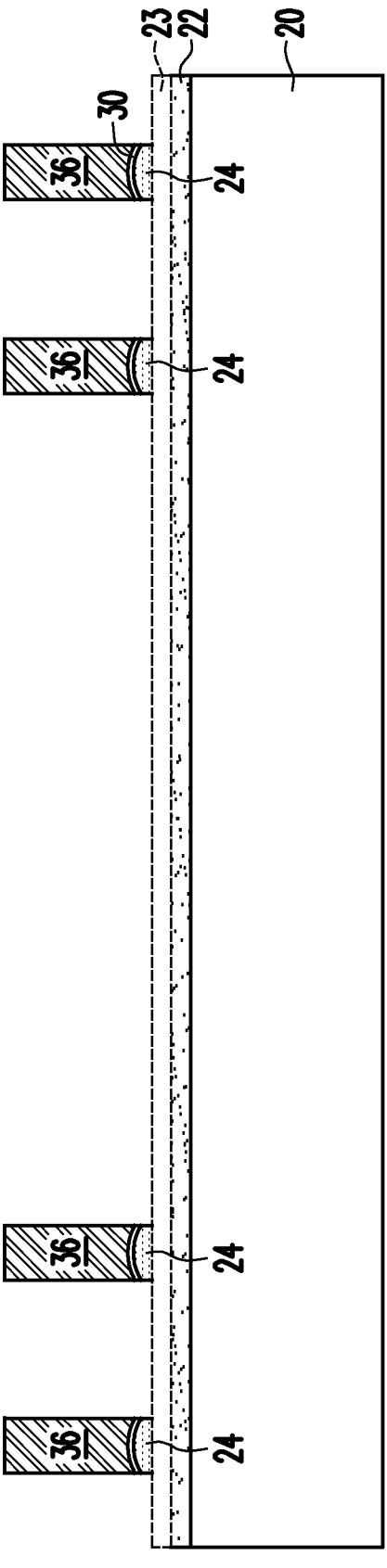

FIGS. 6B and 6C illustrate some embodiments in which polymer dots 24 are wider than the respective overlying through-vias 36. In FIG. 6B, when metal seed layer 30 is etched, the portions of polymer dots 24 extending beyond the edges of through-vias 36 are not etched, and the remaining polymer dots 24 remain to be wider than the respective overlying through-vias 36. In FIG. 6C, when metal seed layer 30 is etched, the portions of polymer dots 24 extending beyond the edges of through-vias 36 are also etched, and hence polymer dots 24 have edges flush with or extend beyond the edges of the respective overlying through-vias 36.

Figure 7:
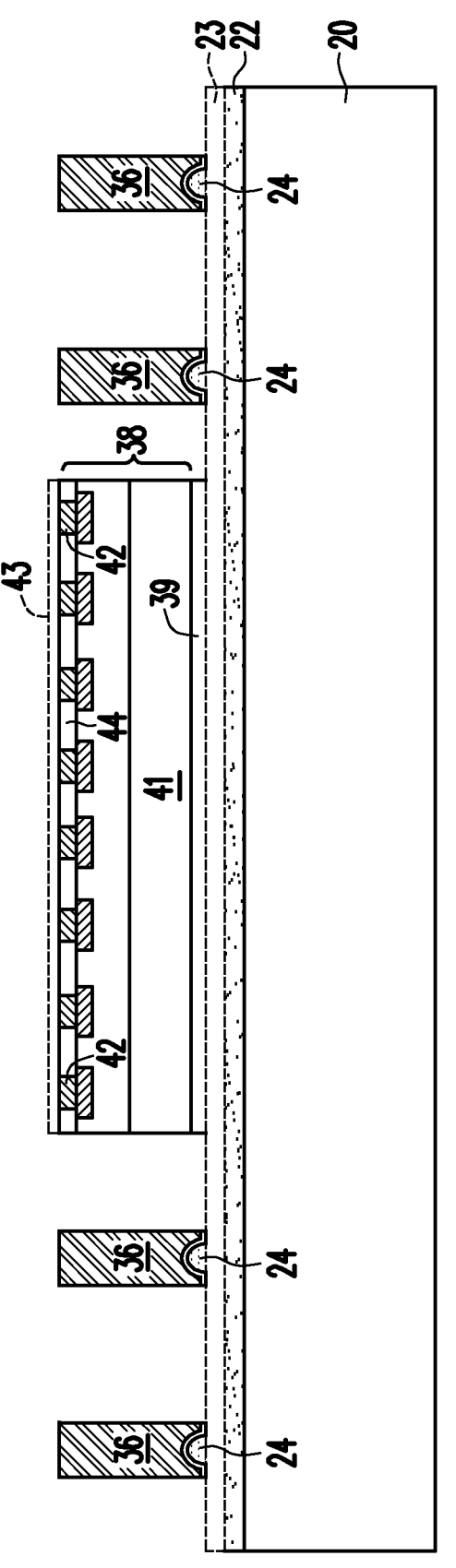

FIG. 7 illustrates the placement/attachment of package component 38. The respective step is shown as step 410 as illustrated in the process flow in FIG. 31. Package component 38 may be a device die, and hence is referred to as device die 38 hereinafter for simplicity, while it can also be another type of package component such as a package, a memory stack, or the like. Device die 38 is attached to LTHC coating material 22 or buffer layer 23 through Die-Attach Film (DAF) 39, which is an adhesive film pre-attached on device die 38 before device die 38 is placed on LTHC coating 22. Accordingly, DAF 39 and device die 38, before attached to LTHC coating material 22, are in combination an integrated piece. Device die 38 may include semiconductor substrate 41 having a back surface (the surface facing down) in physical contact with DAF 39. Device die 38 may include integrated circuit devices (such as active devices, which include transistors, for example, not shown) at the front surface (the surface facing up) of the semiconductor substrate. In accordance with some embodiments of the present disclosure, device die 38 is a logic die, which may be a Central Processing Unit (CPU) die, a Graphic Processing Unit (GPU) die, a mobile application die, a Micro Control Unit (MCU) die, an input-output (TO) die, a BaseBand (BB) die, or an Application processor (AP) die.

In accordance with some exemplary embodiments, metal pillars 42 (such as copper pillars) are pre-formed as portions of device die 38, and metal pillars 42 are electrically coupled to the integrated circuit devices such as transistors (not shown) in device die 38. In accordance with some embodiments of the present disclosure, a dielectric material such as a polymer fills the gaps between neighboring metal pillars 42 to form top dielectric layer 44. Top dielectric layer 44 may also include a portion (represented by dashed line 43) covering and protecting metal pillars 42. Polymer layer 44 may be formed of PBO or polyimide in accordance with some embodiments of the present disclosure.

Figure 8:
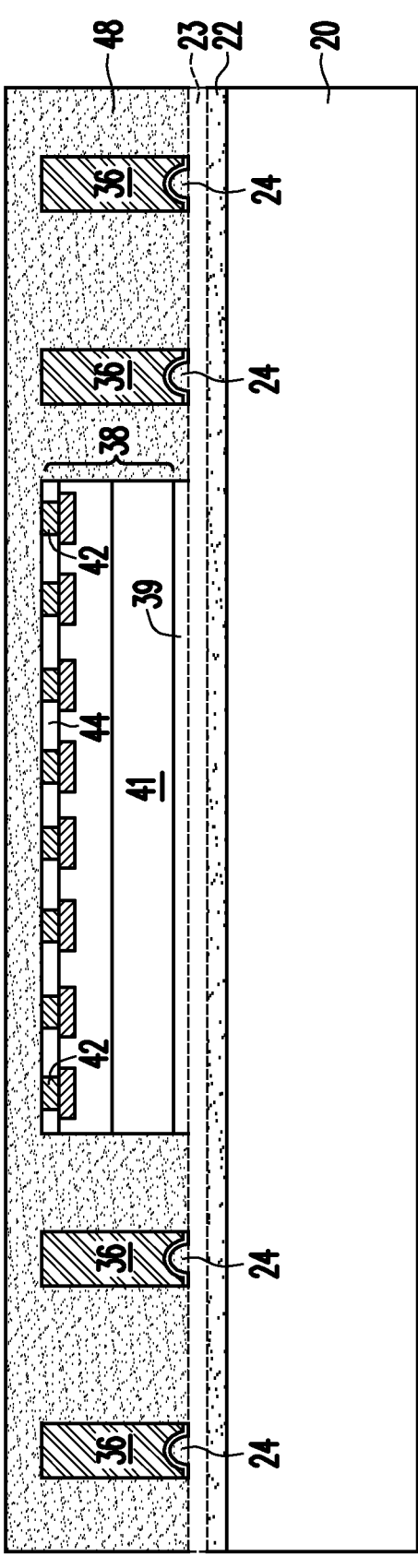

Next, device die 38 and metal posts 36 are encapsulated in encapsulating material 48, as shown in FIG. 8. The respective step is shown as step 412 as illustrated in the process flow in FIG. 31. Encapsulating material 48 fills the gaps between neighboring through-vias 36 and the gaps between through-vias 36 and device die 38. Encapsulating material 48 may include a molding compound, a molding underfill, an epoxy, and/or a resin. The top surface of encapsulating material 48 is higher than the top ends of metal pillars 42. When formed of molding compound, encapsulating material 48 may include a base material, which may be a polymer, a resin, an epoxy, or the like, and filler particles in the base material. The filler particles may be dielectric particles of $SiO_2$, $Al_2O_3$, silica, or the like, and may have spherical shapes. Also, the spherical filler particles may have a plurality of different diameters.

Figure 9:
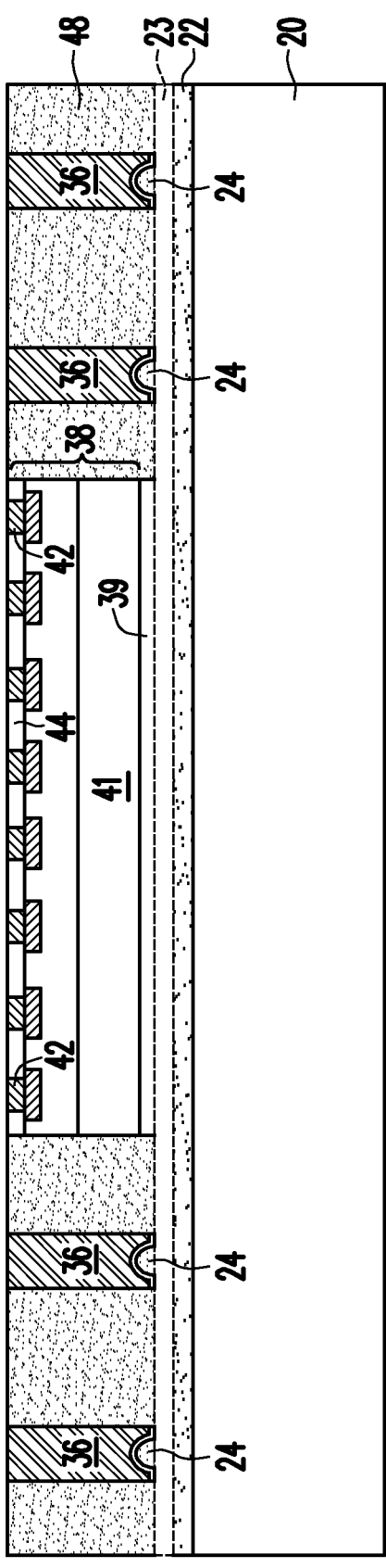

In a subsequent step, as shown in FIG. 9, a planarization process such as a Chemical Mechanical Polish (CMP) process or a mechanical grinding process is performed to thin encapsulating material 48 and dielectric layer 44, until through-vias 36 and metal pillars 42 are revealed. The respective step is also shown as step 412 as illustrated in the process flow in FIG. 31. Due to the planarization process, the top ends of through-vias 36 are substantially level (coplanar) with the top surfaces of metal pillars 42, and are substantially coplanar with the top surface of encapsulating material 48.

Figure 10:
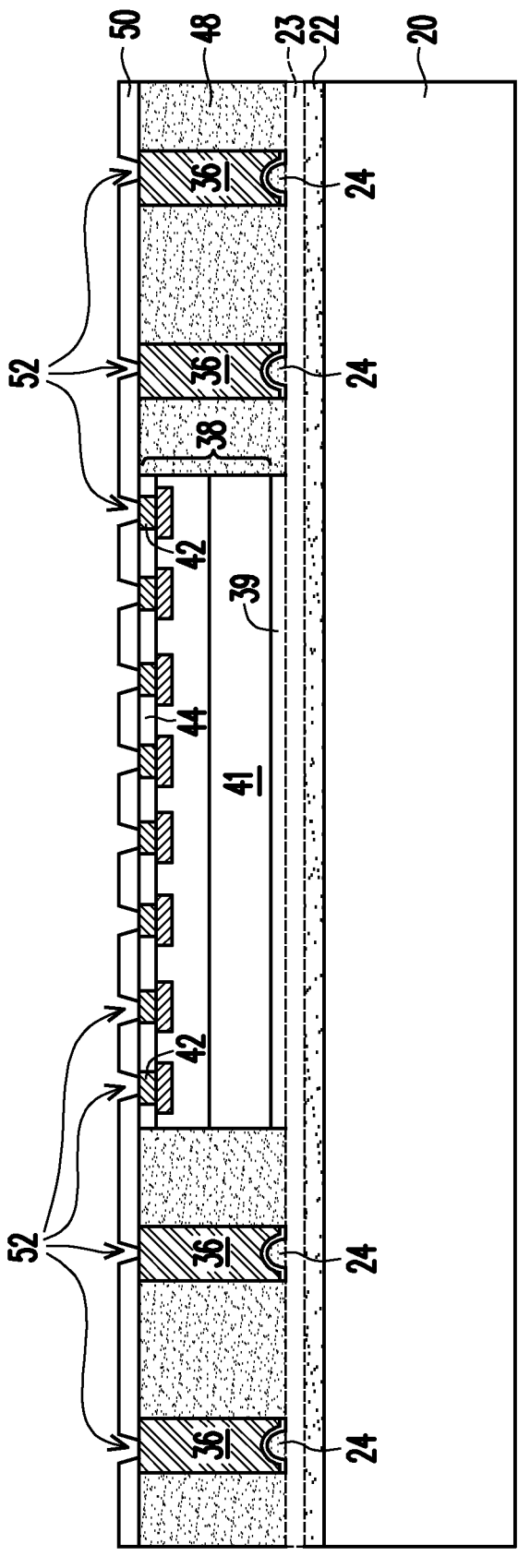
Figure 11:
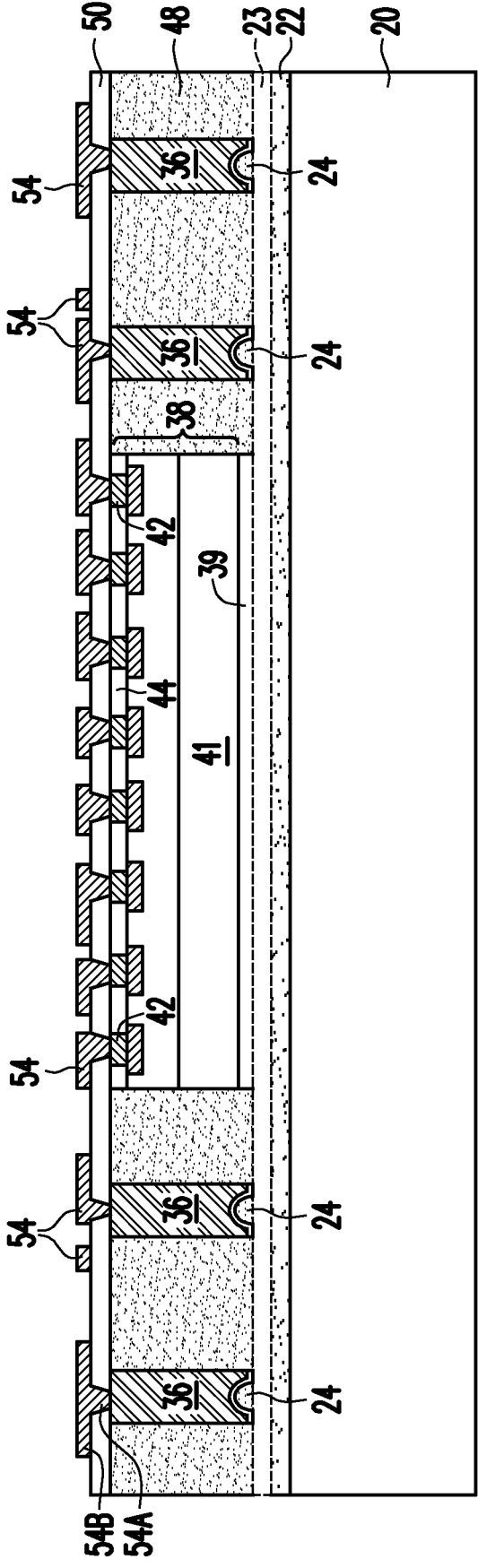

FIGS. 10 through 14 illustrate the formation of Redistribution Lines (RDLs). The respective step is shown as step 414 as illustrated in the process flow in FIG. 31. FIGS. 10 and 11 illustrate the formation of a first layer of RDLs and the respective dielectric layer. Referring to FIG. 10, dielectric layer 50 is formed. In accordance with some embodiments of the present disclosure, dielectric layer 50 is formed of a polymer such as PBO, polyimide, or the like. The formation method includes coating dielectric layer 50 in a flowable form, and then curing dielectric layer 50. In accordance with alternative embodiments of the present disclosure, dielectric layer 50 is formed of an inorganic dielectric material such as silicon nitride, silicon oxide, or the like. The formation method may include Chemical Vapor Deposition (CVD), Atomic Layer Deposition (ALD), Plasma-Enhanced Chemical Vapor Deposition (PECVD), or other applicable deposition methods. Openings 52 are then formed, for example, through a photo lithography process. In accordance with some embodiments in which dielectric layer 50 is formed of a photo-sensitive material such as PBO or polyimide, the formation of openings 52 involves a photo exposure using a lithography mask (not shown), and a development step. Through-vias 36 and metal pillars 42 are exposed through openings 52.

Next, referring to FIG. 11, RDLs 54 are formed over dielectric layer 50. RDLs 54 include vias 54A formed in dielectric layer 50 to connect to metal pillars 42 and through-vias 36, and metal traces (metal lines) 54B over dielectric layer 50. In accordance with some embodiments of the present disclosure, RDLs 54 (including 54A and 54B) are formed in a plating process, which includes depositing a metal seed layer (not shown), forming and patterning a photo resist (not shown) over the metal seed layer, and plating a metallic material such as copper and/or aluminum over the metal seed layer. The metal seed layer and the plated metallic material may be formed of the same material or different materials. The patterned photo resist is then removed, followed by etching the portions of the metal seed layer previously covered by the patterned photo resist. Although not shown, the top surfaces of the portions of RDLs 54 grown from openings 52 may be recessed, and are lower than the portions of RDLs 54 directly overlying dielectric layer 50.

Figure 12:
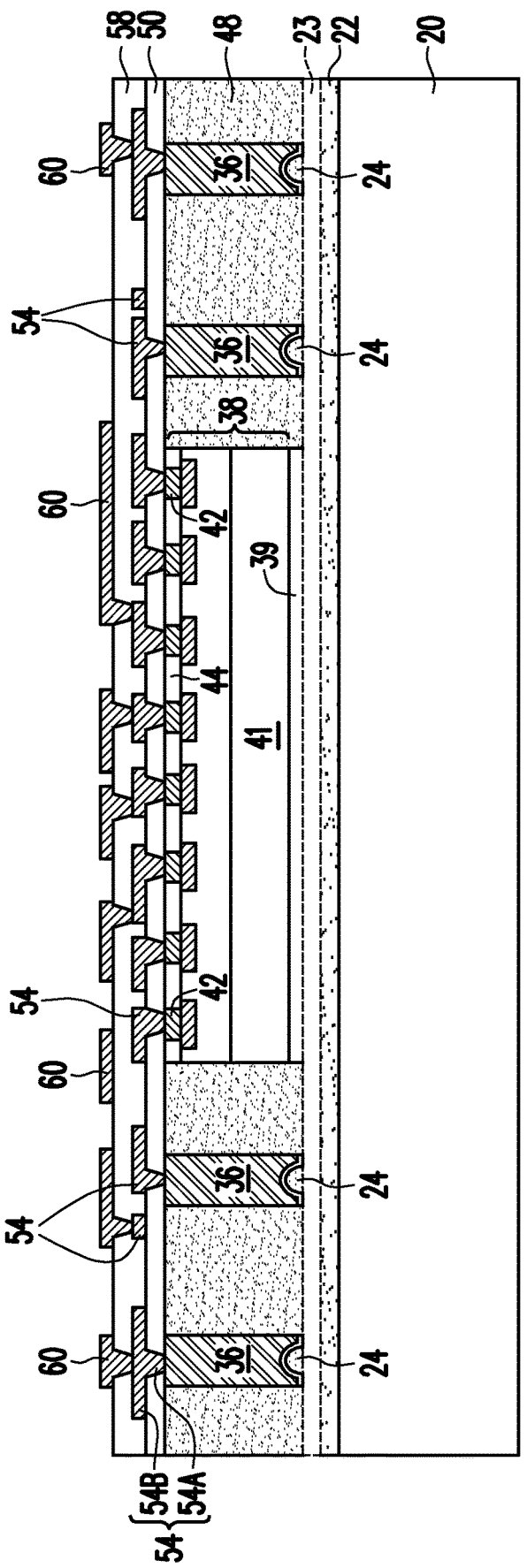

Referring to FIG. 12, in accordance with some embodiments of the present disclosure, dielectric layer 58 is formed over the structure shown in FIG. 11, followed by the formation of openings (filled by RDLs 60) in dielectric layer 58. Some portions of RDLs 54 are thus exposed through the openings. Dielectric layer 58 may be formed using a material selected from the same candidate materials for forming dielectric layer 50, which may include PBO, polyimide, BCB, or other organic or inorganic materials. RDLs 60 are then formed. RDLs 60 also include via portions extending into the openings in dielectric layer 58 to contact RDLs 54, and metal line portions directly over dielectric layer 58. The formation of RDLs 60 may be the same as the formation of RDLs 54, which includes forming a seed layer, forming a patterned mask, plating RDLs 60, and then removing the patterned mask and undesirable portions of the seed layer.

Figure 13:
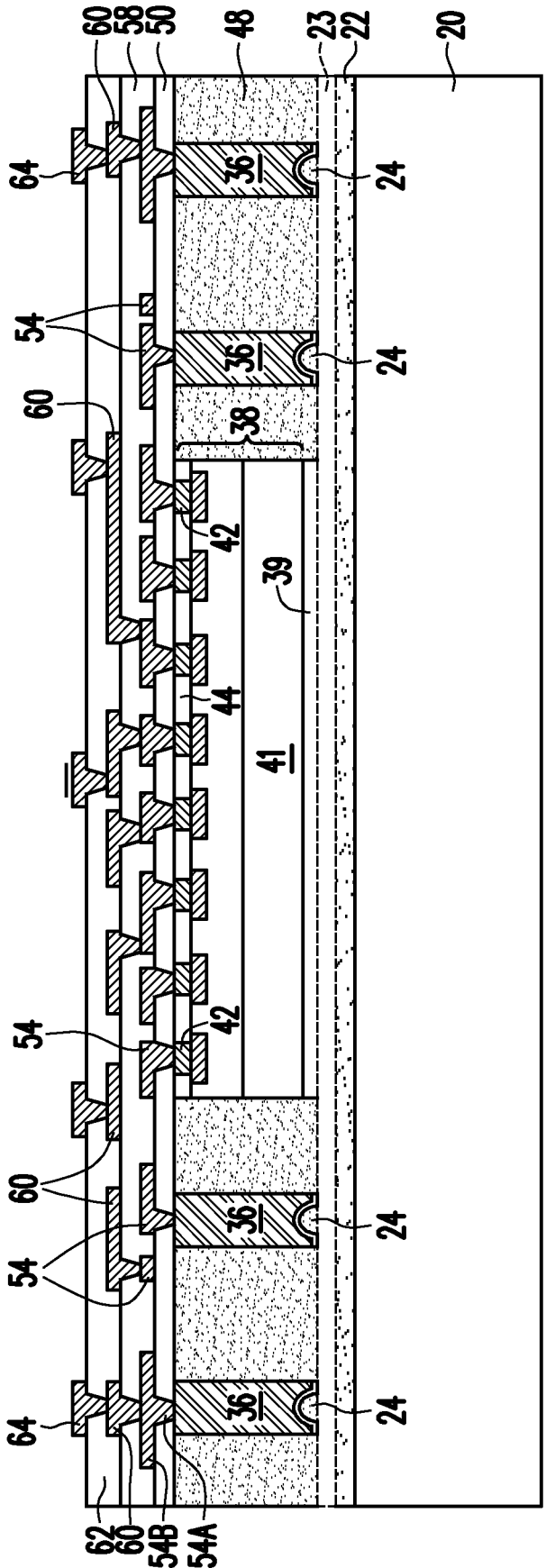

FIG. 13 illustrates the formation of dielectric layer 62 and RDLs 64 over dielectric layer 58 and RDLs 60. Dielectric layer 62 may be formed of a material selected from the same group of candidate materials for forming dielectric layers 50 and 60. RDLs 64 may also be formed of a metal or a metal alloy including aluminum, copper, tungsten, or alloys thereof. It is appreciated that although in the illustrated exemplary embodiments, three layers of RDLs (54, 60 and 64) are formed, the package may have any number of RDL layers such as one layer, two layers, or more than three layers.

Figure 14:
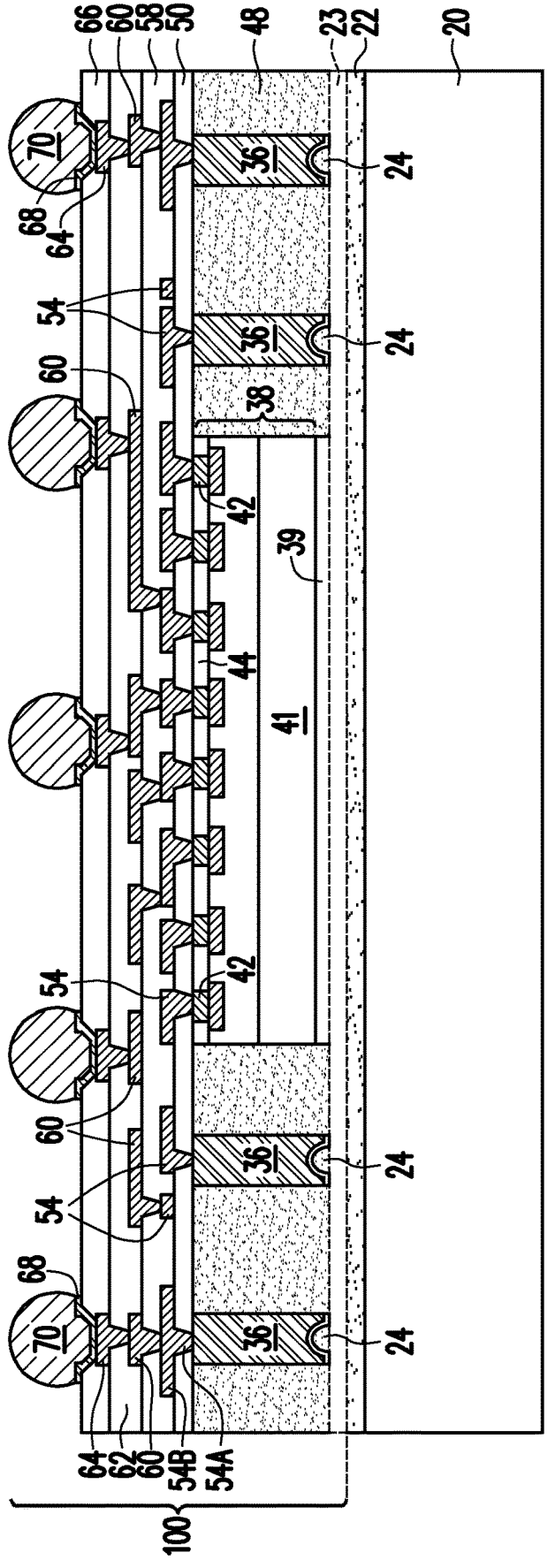

FIG. 14 illustrates the formation of dielectric layer 66, Under-Bump Metallurgies (UBMs) 68, and electrical connectors 70 in accordance with some exemplary embodiments. Dielectric layer 66 may be formed of a material selected from the same group of candidate materials for forming dielectric layers 50, 58, 62 and 66. For example, dielectric layer 66 may be formed using PBO, polyimide, or BCB. Openings are formed in dielectric layer 66 to expose the underlying metal pads, which are parts of RDLs 64 in the illustrative exemplary embodiments. In accordance with some embodiment of the present disclosure, UBMs 68 are formed to extend into the openings in dielectric layer 66 to contact the metal pads in RDLs 64. UBMs 68 may be formed of nickel, copper, titanium, or multi-layers thereof. In accordance with some exemplary embodiments, UBMs 68 include a titanium layer and a copper layer over the titanium layer.

Electrical connectors 70 are then formed. The respective step is shown as step 416 as illustrated in the process flow in FIG. 31. The formation of electrical connectors 70 may include placing solder balls on the exposed portions of UBMs 68, and then reflowing the solder balls, and hence electrical connectors 70 are solder regions. In accordance with alternative embodiments of the present disclosure, the formation of electrical connectors 70 includes performing a plating step to form solder layers over UBMs 68, and then reflowing the solder layers. Electrical connectors 70 may also include non-solder metal pillars, or metal pillars and solder caps over the non-solder metal pillars, which may also be formed through plating. Throughout the description, the structure including release film 22 and the overlying structure in combination is referred to as package 100, which is a composite wafer (and also referred to as composite wafer 100 hereinafter) including a plurality of device dies 38.

Figure 15:
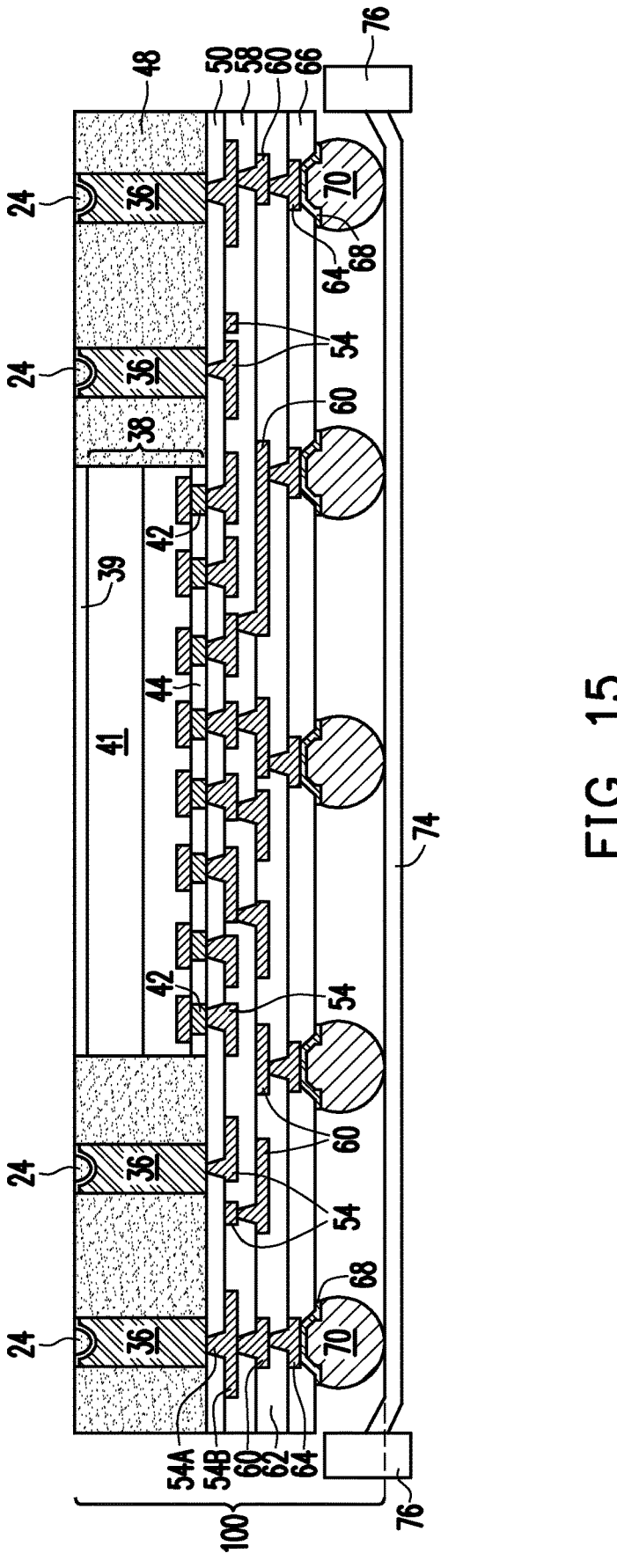

Next, referring to FIG. 15, composite wafer 100 is placed on tape 74, which is attached to frame 76. In accordance with some embodiments of the present disclosure, electrical connectors 70 are in contact with tape 74. Composite wafer 100 is then de-bonded from carrier 20 (FIG. 14), for example, by projecting radiation (such as a laser beam) on LTHC coating material 22, and the radiation penetrates through the transparent carrier 20. The respective step is shown as step 418 as illustrated in the process flow in FIG. 31. As a result, LTHC coating material 22 is decomposed in response to the heat introduced by the radiation. Carrier 20 may thus be lifted off from the decomposed LTHC coating material 22, and hence composite wafer 100 is de-bonded (demounted) from carrier 20. The residue of LTHC coating material 22 is then removed, for example, through a plasma cleaning step. The resulting composite wafer 100 is shown in FIG. 15.

In accordance with some embodiments of the present disclosure in which polymer buffer layer 23 is formed, as shown in FIG. 14, polymer buffer layer 23 is exposed at the top of composite wafer 100. Polymer buffer layer 23 is etched, resulting in the structure as shown in FIG. 15. In accordance with alternative embodiments of the present disclosure, polymer buffer layer 23 is not formed. Through-vias 32, polymer dots 24, encapsulating material 48, and DAF 38 are exposed, as shown in FIG. 15. The exposed polymer dots 24 extend from the top surface of through-vias 36 downwardly.

Figure 16:
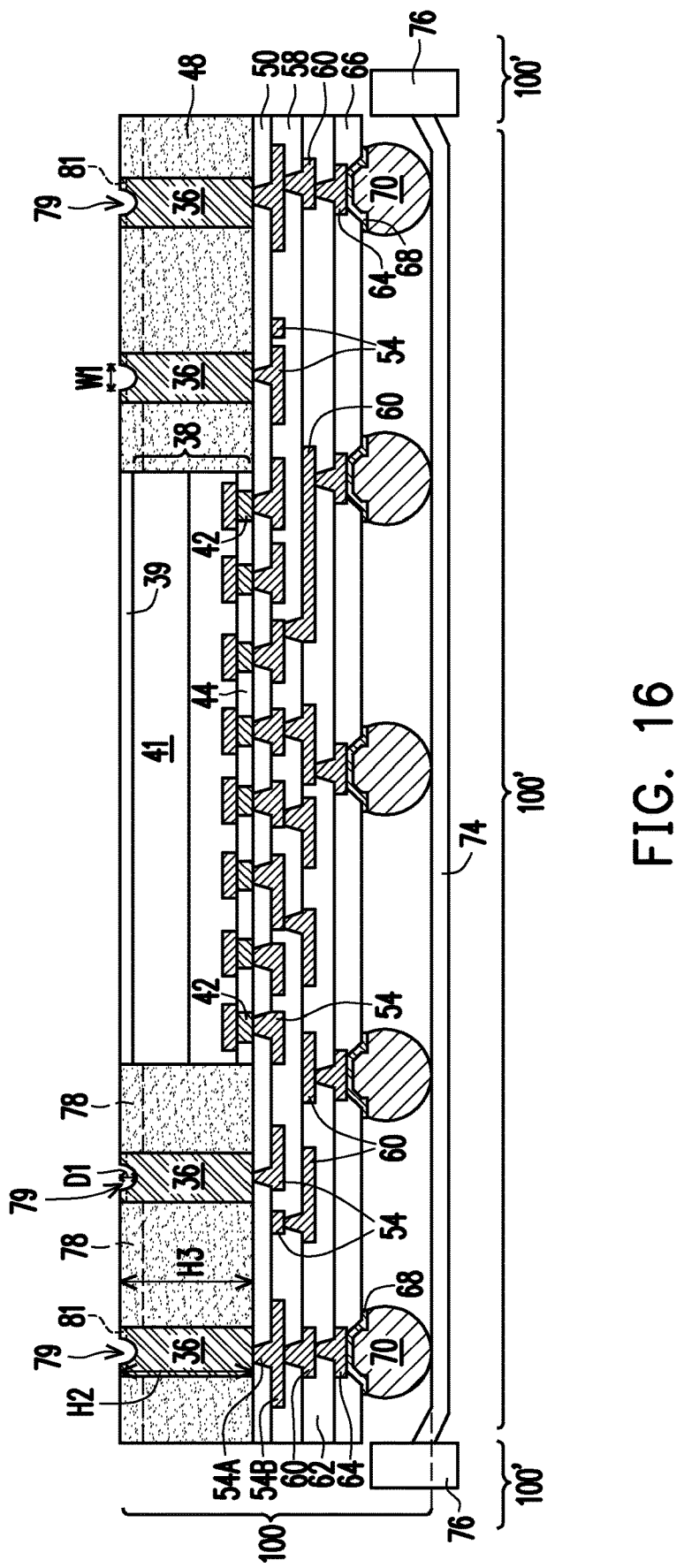

Next, polymer dots 24 are removed, forming recesses 79 extending into through-vias 36. The resulting structure is shown in FIG. 16. The respective step is shown as step 420 as illustrated in the process flow in FIG. 31. In accordance with some embodiments of the present disclosure, polymer dots 24 are removed using laser drill and/or etching. For example, a laser drill may be performed to remove polymer dots 24, followed by a plasma cleaning or a wet cleaning. The laser drill may be performed using a low energy, so that plasma dots 24 are removed, while the metallic portions of through-vias 36 are not damaged. Alternatively, polymer dots 24 and the underlying portions of the titanium layer in metal seed layer 30 are removed, while the copper portions of through-vias 36 are not damaged. The plasma cleaning is used to clean residues, and may be performed using the plasma generated from a process gas including $CF_4$, $O_2$, or the mixture of $CF_4$ and $O_2$. The wet cleaning may be performed using Isopropyl alcohol (IPA), tetra-methyl-ammonium hydroxide (TMAH), HF, or the like.

In accordance with some embodiments of the present disclosure, polymer dots 24 are removed through etching, which includes dry etching or wet etching. The spaces left by the removed polymer dots 24 form recesses 79. The etching chemical (etching gas or etching solution) is selected depending on the material of polymer dots 24. After the etching of polymer dots 24, the titanium layer 30A (FIG. 3) in seed layer 30 is etched. Since titanium has higher electrical resistivity than copper, by removing the titanium layer, the copper portions of through-vias 36, which have a lower resistivity than the titanium layer, are exposed. Hence, the connection to through-vias 36 may be established with a lower resistance. In accordance with some embodiments of the present disclosure, the etching of titanium layer 30A is performed through wet etching using a hydrogen fluoride (HF) solution, a phosphoric acid, or a mixture of HF and phosphoric acid. The etching may also be performed using dry etching.

The depth D1 of recesses 79 may be substantially equal to height H1 of polymer dots 24 (FIG. 29), and may be in the range between about 5 μm and about 50 μm. Ratio D1/H2 may be in the range between about 0.03 and about 0.3, with H2 being the height of through-vias 36. Width W1 of recesses may be in the range between about 120 μm and about 170 μm.

During the etching or cleaning of polymer dots 24, encapsulating material 48 and DAF 39 may also be etched and recessed. The etching rates depend on the materials of encapsulating material 48 and DAF 39 and the type of the etching chemical. As a result, DAF 39 may be etched partially (and hence recessed) or removed entirely. Encapsulating material 48 may also be recessed, and hence the top surface of encapsulating material 48 may be recessed lower than the top surface of through-vias 36. FIG. 16 schematically illustrates dashed lines 78, which represent the likely top surface levels of the recessed encapsulating material 48. The recessed top surface of encapsulating material 48 may also be at any level higher than the illustrated dashed lines 78. As a result of the recessing of encapsulating material 48, height H2 of through-vias 36 may be greater than the height H3 of encapsulating material 48.

In FIG. 16, dashed lines 81 are illustrated to show the interface between titanium layer and the underlying copper containing portions of through-via 36. The dashed lines 81 indicate that the titanium layer may or may not exist.

As also shown in FIG. 16, composite wafer 100 includes a plurality of packages 100', which are identical to each other, with each of packages 100' including a plurality of through-vias 36 and one (or more) device die 38.

Figure 17:
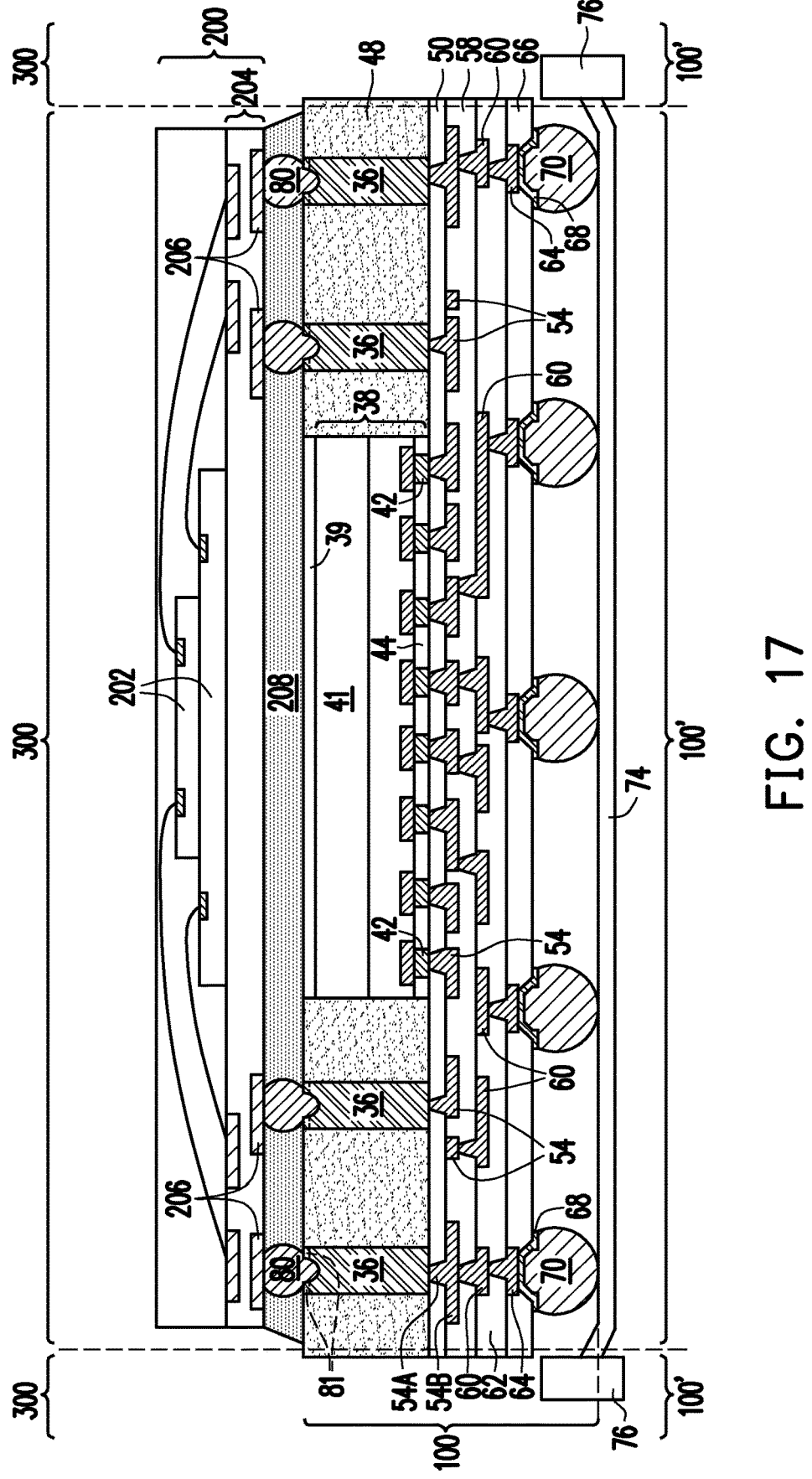

FIG. 17 illustrates the bonding of a plurality of packages 200 (with one package 200 illustrated) onto package 100', thus forming a plurality of identical Package-on-Package (PoP) structure/packages 300. The respective step is shown as step 422 as illustrated in the process flow in FIG. 31. The bonding is performed through solder regions 80, which join through-vias 36 to metal pads 206 in the overlying package 200. Solder regions 80 extend into recesses 79, and may (or may not) be in contact with the top surfaces of through-vias 36, which top surfaces surround the recesses 79 (FIG. 16). In accordance with some embodiments of the present disclosure, package 200 includes package substrate 204 and device die(s) 202, which may be memory dies such as Static Random Access Memory (SRAM) dies, Dynamic Random Access Memory (DRAM) dies, or the like. Underfill 208 is also disposed into the gap between packages 200 and the underlying packages 100', and is cured.

Next, as also shown in FIG. 17, a singulation (die-saw) process is performed to separate composite wafer 100 and the overlying packages 200 into individual packages 300, which are identical to each other. The respective step is shown as step 424 as illustrated in the process flow in FIG. 31. The singulation may be performed on tape 74. The singulation may be performed using a blade, or may be performed using a laser to do pre-grooving, so that grooves are formed, and then using a blade to cut through the corresponding grooves.

FIG. 18 illustrates the bonding of the singulated package 300 to package component 86 through solder regions 70. In accordance with some embodiments of the present disclosure, package component 86 is a package substrate, which may be a coreless substrate or a substrate having a core. In accordance with other embodiments of the present disclosure, package component 86 is a printed circuit board or a package. Solder regions 70 may be bonded to bond pads 88 in package component 86.

Figure 19:
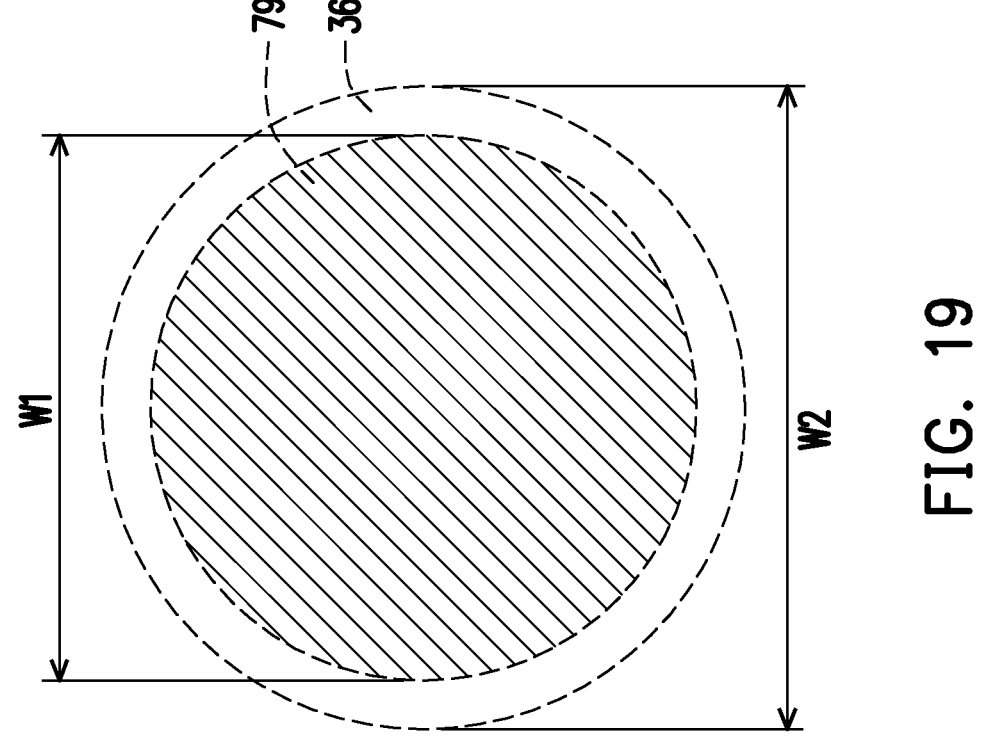
FIG. 19 illustrates a top view of a recess in a through-via in accordance with some embodiments.

FIGS. 19 through 26 illustrates through-vias 36 and corresponding recesses 79 in through-vias 36 or encapsulating material 48 in accordance with some embodiments of the present disclosure. For simplicity, the solder regions 80 (FIG. 18) that fill recesses 79 are not illustrated, while solder regions exist. FIG. 19 illustrates a top view of through-via 36 and recess 79. Some top portions of through-via 36 form a ring encircling recess 79. The top-view shapes of recess 79 and through-via 36 include, and are not limited to, circles, squares, ellipse, hexagons, octagons, or the like. The top-view shown in FIG. 19 may be obtained from the structure shown in FIGS. 20 through 22. Width W1 of recess 79 may be smaller than width W2 of through-via 36. Widths W1 and W2 may be diameters which recess 79 and through-via 36 have circular top-view shapes.

Figure 20:
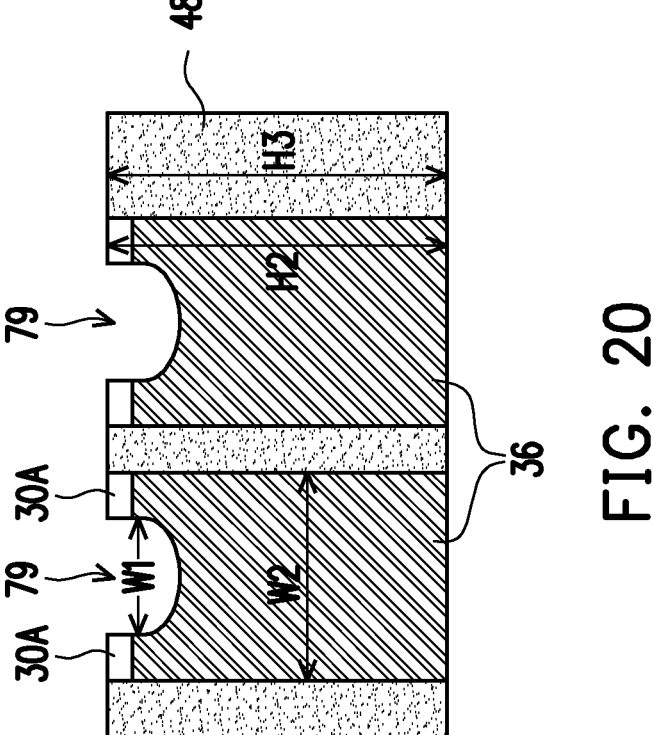

FIG. 20 illustrates through-via 36 in accordance with some embodiments of the present disclosure. Recess 79 extend into through-via 36, and has rounded bottom surfaces and sidewalls, which are the results of the rounded polymer dots 24 (FIGS. 7 and 29). Titanium layer 30A is located on the top of through-via 36, and encircles recess 79. Titanium layer 30A is a remaining portion of the original seed layer 30 (FIG. 3). Since the portion of titanium layer 30A extending into recess 79 has been removed in the polymer removal process, and may be removed by laser drill, no titanium layer extends into recess 79.

Figure 21:
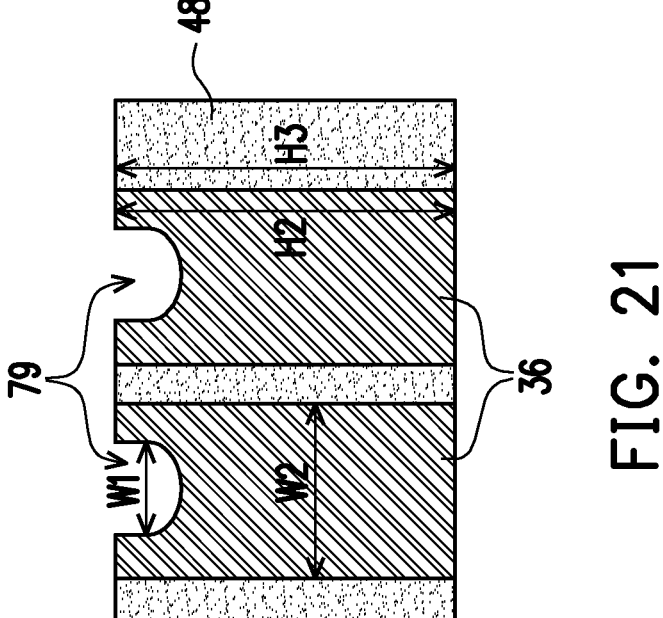
FIGS. 20 through 26 illustrate the cross-sectional views of some recesses in packages in accordance with some embodiments.

FIG. 21 illustrates through-via 36 in accordance with some embodiments of the present disclosure. Recess 79 extends into through-via 36, and has rounded bottom surfaces and sidewalls, which are the results of the rounded polymer dots 24 (FIGS. 7 and 29). No titanium layer is left on the top of through-via 36. For example, during or after the polymer removal process, the titanium layer in the metal seed layer (FIG. 3) may be removed through etching.

Figure 22:
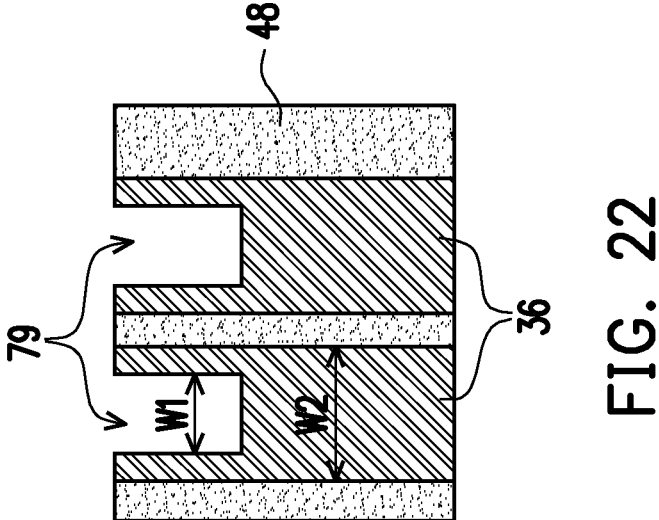

FIG. 22 illustrates through-via 36 in accordance with some embodiments of the present disclosure. Recess 79 extends into through-via 36, and has substantially straight and vertical sidewalls. Furthermore, the bottom surface of recess 79 may be substantially planar. Recess 79 in accordance with these embodiments may be formed by forming polymer dots using patterned photo resist. No titanium layer is left on top of through-via 36. For example, during or after the polymer removal process, the titanium layer in the metal seed layer may be removed through etching.

FIGS. 23 through 26 illustrate through-vias 36 and recesses 79 in accordance with some embodiments of the present disclosure, in which the polymer dots are wider than the corresponding through-via 36. The formation process may be found in FIG. 5B, for example. Also, in accordance with some embodiments of the present disclosure, the top surface of encapsulating material 48 is higher than the top end/surface of through-via 36, and hence recess 79 is defined by, and is exposed to, encapsulating material 48.

Figure 23:
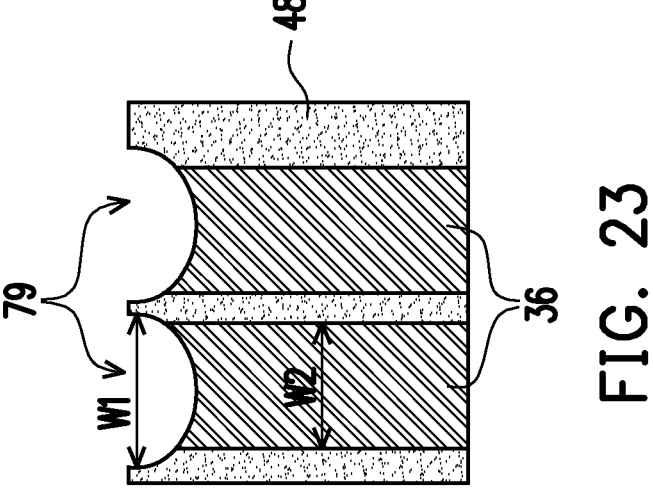

FIG. 23 illustrates through-via 36 and recess 79 in accordance with some embodiments of the present disclosure. In accordance with these embodiments, no titanium layer exists at the top surface of through-via 36. The top surface of through-via 36 is rounded, and may (or may not) continuously connect to the top surfaces of the surrounding portions of encapsulating material 48. The structure shown in FIG. 23 may be formed using the process shown in FIG. 6B.

Figure 24:
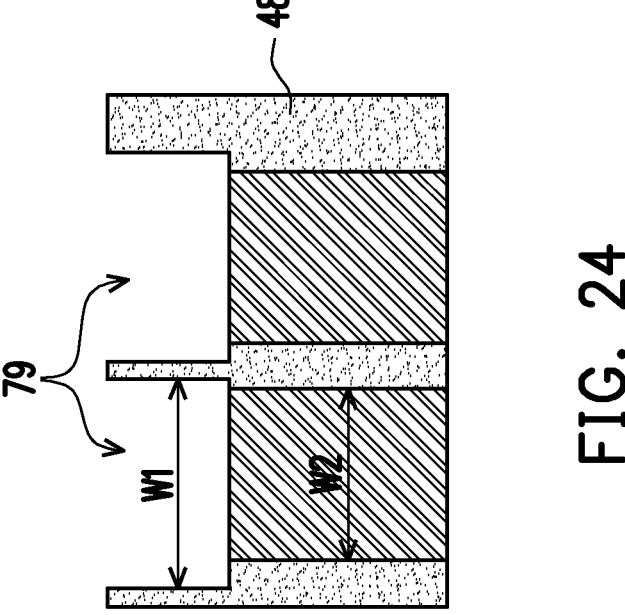

FIG. 24 illustrates through-via 36 and recess 79 in accordance with some embodiments of the present disclosure. In accordance with these embodiments, no titanium layer is at the top surface of through-via 36. The top surface of through-via 36 is substantially planar, and may (or may not) continuously connect to the substantially planar top surfaces of the surrounding portions of encapsulating material 48. Recess 79 in accordance with these embodiments may also be formed by using patterned photo resist as sacrificial dots. The structure shown in FIG. 24 may be formed using the process shown in FIG. 6B (except polymer dots 24 will have vertical sidewalls and planar top surfaces).

Figure 25:
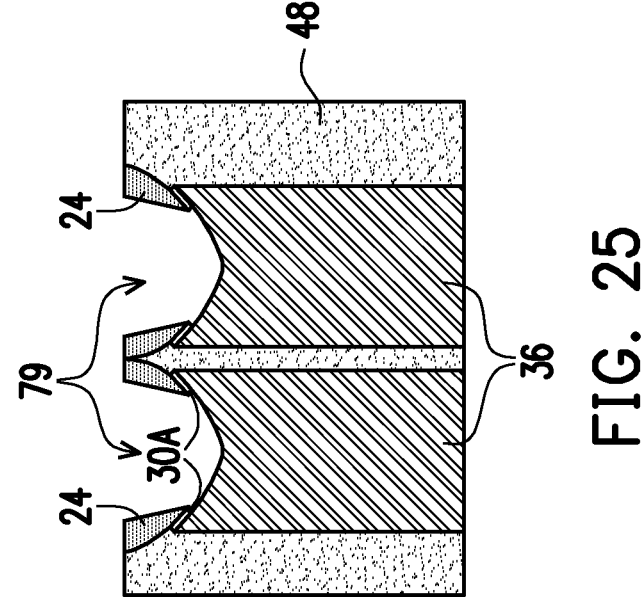

FIG. 25 illustrates through-via 36 and recess 79 in accordance with some embodiments of the present disclosure. In accordance with these embodiments, polymer dot 24 has remaining portions remaining in the final structure (as shown in FIG. 18) and extend beyond edges of through-vias 36. The remaining polymer dot 24 will be in contact with solder region 80 (FIG. 18). The structure shown in FIG. 25 may be formed using the process shown in FIG. 6B. In FIG. 25, titanium layer 30A has portions overlapped by polymer dot 24, which portions further overlap through-via 36. Other portions of titanium layer 30A have been removed either in the process shown in FIG. 6B or the process shown in FIG. 16. As shown in FIG. 25, combining with FIG. 18, the solder region 80 will fill the recess 79 as shown in FIG. 25. An underfill 208 (FIG. 18) contacts the encapsulating material 48, and the underfill 208 is physically spaced apart from the through-via 36, as can be realized from FIG. 25. Furthermore, a polymer dot 24 (FIG. 25) overlaps the through-via 36, and the polymer dot 24 spaces the underfill 208 apart from the through-via 36.

Figure 26:
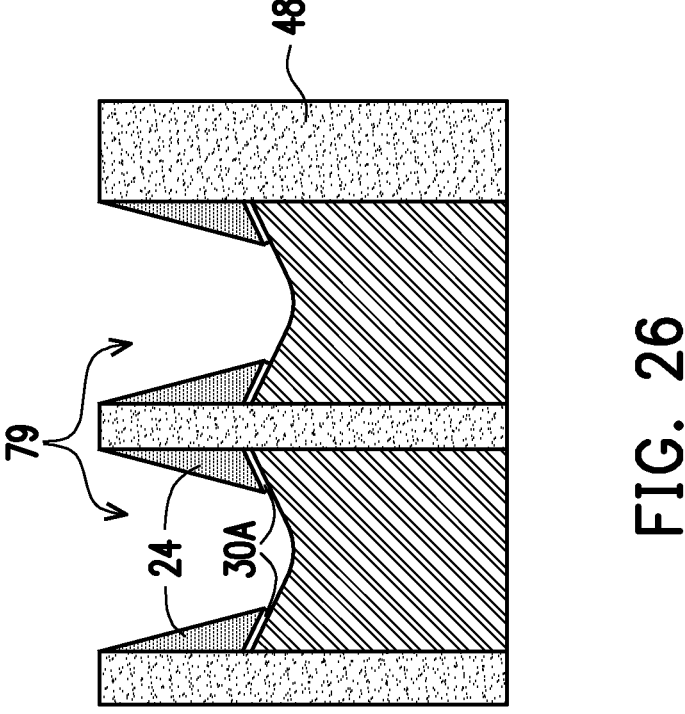

FIG. 26 illustrates through-via 36 and recess 79 in accordance with some embodiments of the present disclosure. In accordance with these embodiments, polymer dot 24 has remaining portions remaining in the final structure (as shown in FIG. 18), and the edges of remaining polymer dot 24 are flush with the edges of through-vias 36. The remaining polymer dot 24 will be in contact with solder region 80 (FIG. 18). The structure shown in FIG. 26 may be formed using the process shown in FIG. 6C. in FIG. 26, titanium layer 30A has some portions overlapped by polymer dot 24, which portions further overlap through-via 36. Other portions of titanium layer 30A have been removed either in the process shown in FIG. 6C or the process shown in FIG. 16.

Figure 27B:
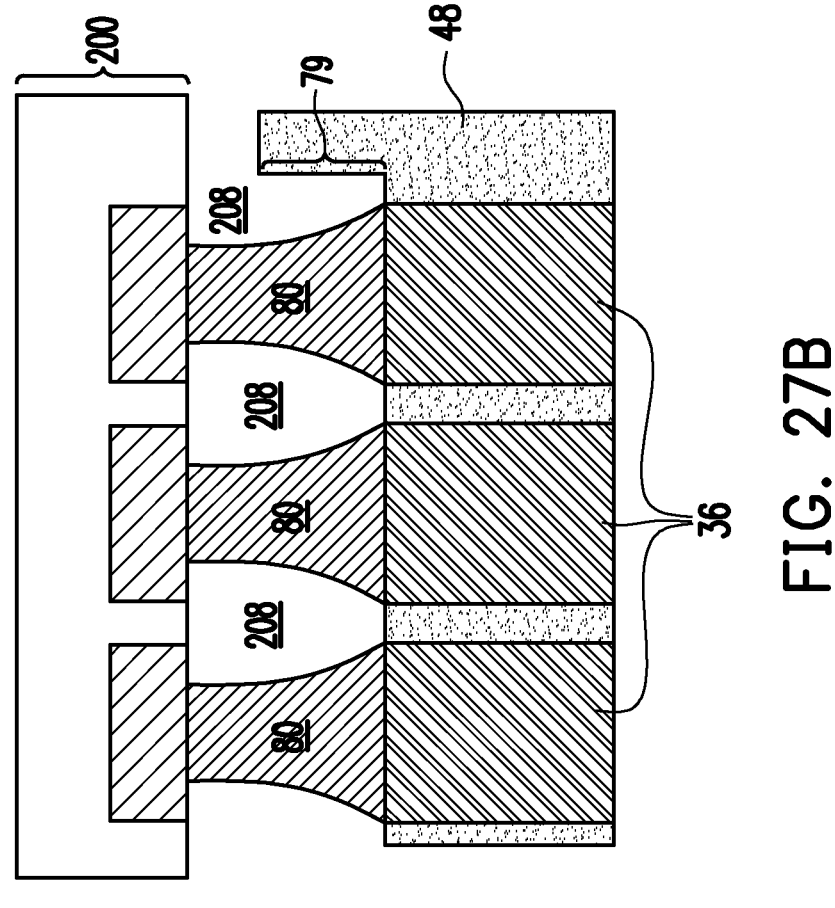
FIGS. 27A and 27B illustrate a top view and a cross-sectional view, respectively, of an elongated recess in packages in accordance with some embodiments.
Figure 27A:
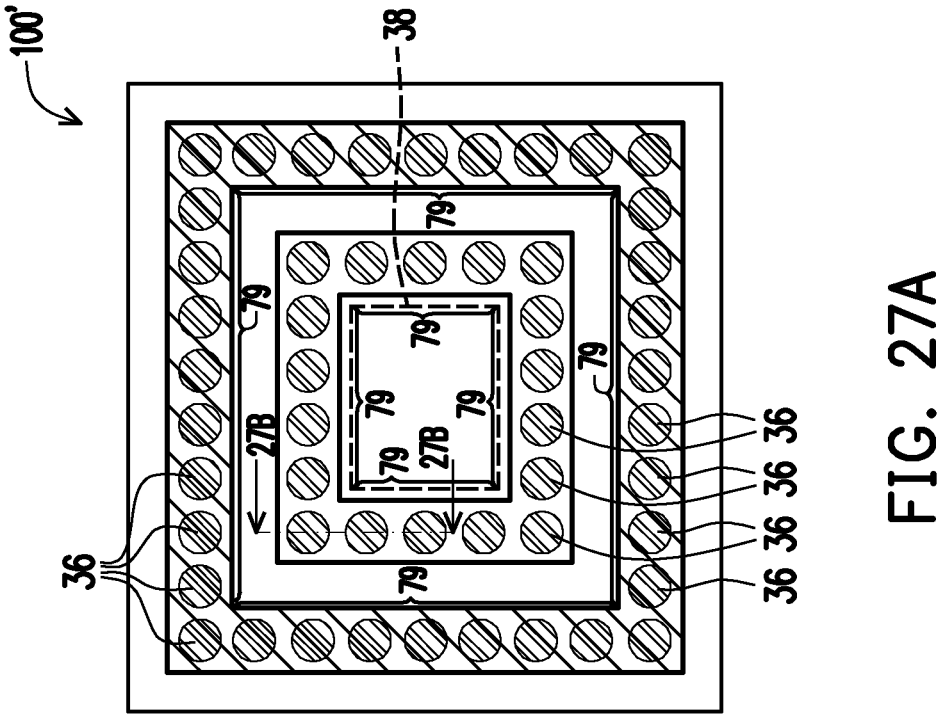

FIGS. 27A and 27B illustrate the top views and cross-sectional views of a package in accordance with some embodiments. Referring to FIG. 27A, which shows a top view of package 100', encapsulating material 48 has recesses 79 forming elongated strips. Through-vias 36 are exposed to the elongated recess strips 79. In accordance with some embodiments, the elongated recess strips 79 are interconnected to form recess rings, and FIG. 27A illustrates two recess rings as an example.

FIG. 27B illustrates a cross-sectional view of the structure shown in FIG. 27A, wherein the cross-sectional view is obtained from the plane containing line 27B-27B in FIG.

27A. As shown in FIG. 27B, recess 79 extends over a plurality of through-vias 36. This may be considered as that the recesses 79 formed for each of through-vias 36 are interconnected, with no encapsulating material 48 separating the recesses. Solder regions 80 for connecting through-vias 36 to package component 200 are also illustrated.

The process for forming the recess strips or rings 79 in FIGS. 27A and 27B may include forming photo resist strips or rings as sacrificial/polymer dots. For example, the exemplary process for forming the package including the recess rings may be essentially the same as shown and described in FIGS. 1 through 18, except that the polymer dot 24 shown FIGS. 2A and 2B is replaced with the photo resist 24 as shown in FIGS. 28A and 28B. FIG. 28A shows the cross-sectional view of photo resist 24, which have substantially straight and vertical edges, and substantially planar top surfaces. FIG. 28B illustrates the top view of photo resist 24, which form rings. The material of photo resist 24 is different from the material of photo resist 32 in FIG. 5A, so that in the step of etching metal seed layer (FIG. 6B), photo resist 24 is not etched. The rings of photo resist 24 will eventually result in recesses 79 as shown in FIGS. 27A and 27B.

Figure 30:
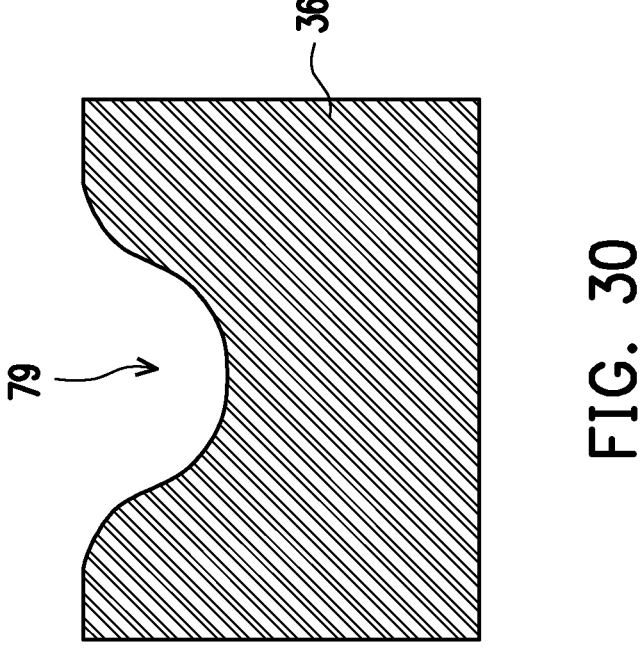
FIGS. 29 and 30 illustrate the details of a polymer dot and a recess in a through-via, respectively, in accordance with some embodiments.

FIG. 29 illustrates a cross-sectional view of an exemplary polymer dot 24 in detail. Due to the flowability and the high viscosity, the top portion of polymer dot 24 is curved and rounded. The top surface of polymer dot has portion 24A that is rounded. Surface portions 24B have greater slopes than top portion 24A. The slope of portions 24C is reduced to be lower than that of portions 24B. FIG. 30 illustrates a resulting recess 79 formed due to the polymer dot 24 having the shape as shown in FIG. 29. Accordingly, the bottom surface of recess 79 has the inverted shape of the top surface shape of polymer 24 as shown in FIG. 29.

In the above-illustrated exemplary embodiments, some exemplary processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. In some applications such as System-on-Chip (SOC) packaging, the SOC (corresponding to device die 38 as in FIG. 18) has heat dissipation problems due to the significant heat generated in the SOC die. For good heat dissipation, the device die preferably has a thick silicon substrate, so that more heat can be dissipated from the sidewalls of the silicon substrate. However, this means the total package thickness is increased, sometimes as much as 40 percent. In accordance with some embodiments of the present disclosure, recesses are formed in through-vias, so that some portions of solder regions are in recesses, and the total thickness of the package does not change, even if the thickness of the device die increases for better heat dissipation.

In accordance with some embodiments of the present disclosure, a package includes a first chip; a plurality of metal posts surrounding the first chip, wherein the plurality of metal posts comprises a first recessed metal post; an encapsulating material surrounding the first chip and the plurality of metal posts, wherein a top surface of the first recessed metal post comprises a first portion lower than a top surface level of the encapsulating material; a redistribution structure underlying and electrically connecting to the first chip and the plurality of metal posts; a plurality of connection pads underlying and electrically connecting to the redistribution structure; and a second chip electrically connecting to the first recessed metal post. In accordance with some embodiments, the top surface of the first recessed metal post further comprises a second portion encircling the first portion, and the second portion is higher than the first portion. In accordance with some embodiments, the first portion of the top surface of the first recessed metal post is curved in a cross-sectional view of the metal post. In accordance with some embodiments, the first recessed metal post comprises a copper-containing portion; and a titanium-containing layer over the copper-containing portion, wherein the first portion of the top surface of the first recessed metal post comprises a top surface of the copper-containing portion, and the second portion of the top surface of the first recessed metal post comprises a top surface of the titanium-containing layer. In accordance with some embodiments, the package further includes a solder region in contact with the first portion of the first recessed metal post, wherein the solder region bonds the second chip to the first chip. In accordance with some embodiments, the top surface of the first recessed metal post further comprises a second portion encircling the first portion, and the package further comprises a polymer over and contacting the second portion. In accordance with some embodiments, the plurality of metal posts further comprises a second recessed metal post, with a portion of the encapsulating material between the first recessed metal post and the second recessed metal post, and a top surface of the portion of the encapsulating material is lower than the top surface level of the encapsulating material.

In accordance with some embodiments of the present disclosure, a method includes dispensing a sacrificial region over a carrier, and forming a metal post over the carrier. The metal post overlaps at least a portion of the sacrificial region. The method further includes encapsulating the metal post and the sacrificial region in an encapsulating material, demounting the metal post, the sacrificial region, and the encapsulating material from the carrier, and removing at least a portion of the sacrificial region to form a recess extending from a surface level of the encapsulating material into the encapsulating material. In an embodiment, the forming the metal post comprises: depositing a blanket metal seed layer extending on a sidewall and a top surface of the sacrificial region; forming a patterned photo resist over the blanket metal seed layer; and plating the metal post in an opening in the patterned photo resist. In an embodiment, the blanket metal seed layer comprises a titanium layer and a copper layer over the titanium layer, and after the sacrificial region is removed to form the recess, a portion of the titanium layer in the recess is removed. In an embodiment, the metal post overlaps an entirety of the sacrificial region, and extends beyond edges of the sacrificial region, and the recess extends into, and is encircled by, a portion of the metal post. In an embodiment, the metal post overlaps a first portion of the sacrificial region, and the sacrificial region further comprises a second portion extending beyond edges of the metal post, and the encapsulating material has sidewalls exposed to the recess. In an embodiment, the dispensing the sacrificial region comprises: dispensing a polymer dot; and curing the polymer dot. In an embodiment, an entirety of the sacrificial region is removed. In an embodiment, a first portion of the sacrificial region is removed, and a second portion of the sacrificial region remains unremoved.

In accordance with some embodiments of the present disclosure, a method includes dispensing a polymer dot; depositing a metal seed layer on the polymer dot; forming a patterned mask over the metal seed layer, wherein an opening in the patterned mask overlaps an entirety of the polymer dot; forming a metal post in the opening; removing the patterned mask and portions of the metal seed layer covered by the patterned mask; placing a device die at a same level as the metal post; encapsulating the device die and the metal post in an encapsulating material; removing at least a portion of the polymer dot to form a recess extending into the metal post, wherein the metal post comprises a ring portion encircling the recess; and forming a solder region extending into the recess. In an embodiment, the removing the polymer dot comprises a laser drill. In an embodiment, the removing the polymer dot comprises an etching process. In an embodiment, the method further includes removing a first titanium portion in the metal seed layer, wherein the first titanium portion is on a curved surface of the polymer dot. In an embodiment, a second titanium portion in the metal seed layer remains after the first titanium portion is removed, and the second titanium portion comprises a planar portion on a planar surface of the metal post. In an embodiment, after the recess is formed, the polymer dot comprises a portion encircled by, and at a same level as, a portion of the metal post. In an embodiment, the recess has a rounded bottom surface.

In accordance with some embodiments of the present disclosure, a package includes an encapsulating material; a metal post in the encapsulating material; a solder region comprising a first portion extending from a top surface of the encapsulating material into the encapsulating material, wherein a portion of the metal post encircles the first portion of the solder region; and a device die in the encapsulating material. In an embodiment, all sidewalls of the first portion of the solder region are in contact with sidewalls of the metal post. In an embodiment, the package further includes a polymer material extending into the metal post, and the first portion of the solder region has sidewalls in contact with sidewalls of the polymer material. In an embodiment, the package further includes a titanium layer between the metal post and the polymer material. In an embodiment, the first portion of the solder region forms an interface with the metal post, and the interface is rounded.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A structure comprising:
a device die;
an encapsulant, wherein the device die is in the encapsulant;

a polymer in a recess formed in the encapsulant, wherein the polymer and the encapsulant comprise different materials;

a through-via penetrating through the encapsulant, wherein the through-via comprises a copper post comprising:

a vertical-and-straight outer edge contacting the encapsulant; and a curved top surface, wherein the polymer overlaps a part of the curved top surface; and a solder region over and joined to the through-via, wherein the solder region comprises a portion in the copper post, and wherein the portion of the solder region contacts the curved top surface of the copper post.

2. The structure of claim 1, wherein the polymer further comprises a portion overlapping and contacting the encapsulant.

3. The structure of claim 1, wherein top surfaces of the polymer and the encapsulant are coplanar.

4. The structure of claim 1 further comprising a metal seed layer overlapping the part of the curved top surface, wherein the metal seed layer comprises an additional curved top surface.

5. The structure of claim 4, wherein the metal seed layer comprises a titanium layer.

6. The structure of claim 4, wherein the metal seed layer comprises an edge vertically aligned to the vertical-and-straight outer edge of the copper post.

7. The structure of claim 1, wherein a topmost point of the curved top surface is lower than a top surface of a portion of the encapsulant.

8. The structure of claim 7 further comprising an underfill physically contacting the top surface of the portion of the encapsulant.

9. The structure of claim 1, wherein the encapsulant comprises a molding compound.

10. The structure of claim 1, wherein the polymer comprises polybenzoxazole (PBO) or polyimide.

11. A structure comprising:

a device die;

a die-attach film over the device die;

a molding compound, with the device die being in the molding compound;

a through-via in the molding compound, wherein the through-via comprises a vertical-and-straight outer edge contacting the molding compound;

a polymer overlapping the through-via and in a recess formed in the molding compound, wherein the polymer and the molding compound comprise different materials; and a solder region comprising a portion in the through-via, wherein the solder region forms a curved interface with a first curved top surface of the through-via, wherein the curved interface has a lowest point, and wherein the first curved top surface of the through-via continuously curves from the lowest point to the vertical-and-straight outer edge of the through-via, and wherein the vertical-and-straight outer edge has a first topmost end higher than a second topmost end of the curved interface.

12. The structure of claim 11 further comprising an underfill contacting the molding compound, wherein the underfill is physically spaced apart from the through-via.

13. The structure of claim 11, wherein the through-via comprises a copper post and a metal seed layer over the copper post, wherein the copper post comprises the first curved top surface, and wherein the metal seed layer comprises a second curved top surface.

14. The structure of claim 11, wherein the polymer comprising a first part overlapping the through-via, and a second part overlapping the molding compound.

15. The structure of claim 11, wherein the polymer comprises polybenzoxazole (PBO) or polyimide.

16. A structure comprising:

a device die;

a molding compound molding the device die therein, wherein the molding compound comprises:

a first plurality of top surfaces that are planar; and a second plurality of top surfaces that are curved, wherein top ends of the second plurality of top surfaces are lower than, and are joined to, respective ones of the first plurality of top surfaces;

a through-via in the molding compound;

a solder region contacting the through-via to form a rounded interface; and a polymer contacting the solder region, wherein a portion of the polymer is in a recess of the through-via.

17. The structure of claim 16, wherein one of the second plurality of top surfaces has a lowest end vertically aligned to an outer edge of the through-via.

18. The structure of claim 14, wherein the second part of the polymer physically contacts the molding compound.

19. The structure of claim 16, wherein the through-via comprises a copper region and a seed layer on the copper region, and wherein the copper region and the seed layer form a curved interface.

20. The structure of claim 19, wherein the polymer comprising an additional portion contacting the molding compound to form an additional curved interface.

\* \* \* \* \*